US008134164B2

(12) United States Patent
Ogihara et al.

(10) Patent No.: US 8,134,164 B2

(45) Date of Patent: Mar. 13, 2012

(54) SEMICONDUCTOR DEVICE, OPTICAL PRINT HEAD AND IMAGE FORMING APPARATUS

(75) Inventors: Mitsuhiko Ogihara, Hachioji (JP); Hiroyuki Fujiwara, Hachioji (JP); Tomohiko Sagimori, Hachioji (JP)

(73) Assignee: Oki Data Corporation, Tokyo (JP)

(*) Notice: Subject to any disclaimer, the term of this patent is extended or adjusted under 35 U.S.C. 154(b) by 130 days.

(21) Appl. No.: 12/394,610

(22) Filed: Feb. 27, 2009

(65) Prior Publication Data

US 2009/0242905 A1 Oct. 1, 2009

(30) Foreign Application Priority Data

Mar. 26, 2008 (JP) ................................ 2008-080905

(51) Int. Cl.
*H01L 29/18* (2006.01)
*H01L 33/00* (2006.01)

(52) U.S. Cl. .................... 257/88; 257/93; 257/E27.121; 257/E23.116; 438/21

(58) Field of Classification Search ............ 257/E27.121
See application file for complete search history.

(56) References Cited

U.S. PATENT DOCUMENTS

2005/0269579 A1* 12/2005 Yukimoto et al. .............. 257/81
2006/0192214 A1* 8/2006 Ogihara et al. ................. 257/79
2007/0252156 A1* 11/2007 Ogihara et al. ................. 257/79

FOREIGN PATENT DOCUMENTS

JP 2004-179641 A 6/2004
JP 2007-294725 A 11/2007
JP 2008028322 A 2/2008

* cited by examiner

*Primary Examiner* — Ha Tran T Nguyen
*Assistant Examiner* — Shaka Scarlett
(74) *Attorney, Agent, or Firm* — Panitch Schwarze Belisario & Nadel LLP

(57) ABSTRACT

A semiconductor device and an optical print head, an image forming apparatus that has the semiconductor device are supplied capable of reduce occurrence probability of defect. The semiconductor device is formed by using semiconductor thin film bonded on the substrate, and includes a covering layer that covers at least one part region of the semiconductor thin film and covers at least one part of electroconductive member connecting with the semiconductor thin film.

17 Claims, 25 Drawing Sheets

SEMICONDUCTOR DEVICE, OPTICAL PRINT HEAD AND IMAGE FORMING APPARATUS

FIELD OF THE INVENTION

The invention relates to a semiconductor device, an optical print head and an image forming apparatus which uses the semiconductor device or the optical print head.

BACKGROUND OF THE INVENTION

Many semiconductor chips to form semiconductor device, are formed on an appointed semiconductor wafer at the same time. Then, the semiconductor wafer is cut off through scraper and dicing saw, so these semiconductor chips are formed. Moreover, these semiconductor chips are implemented on an appointed substrate, so that a semiconductor device is formed through related fabrication process. In Patent document 1, as an example of semiconductor device, an aspect is disclosed that semiconductor thin-film containing lighting element is bonded on the semiconductor substrate including a drive integrated circuit which drives the lighting element.

Patent document 1: Japan patent publication 2004-179641.

However, defect occurs in semiconductor chips according a probability in the above-stated process. Especially, as the semiconductor chips, there is a problem should be solved that the occurrence probability of defect becomes higher when semiconductor thin-film is used.

SUMMARY OF THE INVENTION

It is, therefore, an objective of the invention to provide semiconductor device, an optical print head and an image forming apparatus which uses the semiconductor device or the optical print head, capable of solving the above problem. This invention a structure with high reliability through lowering probability in appearance of crystal defects in the semiconductor devise.

A first aspect of the invention is to provide a semiconductor device which is formed by using semiconductor thin film bonded by intermolecular force on the substrate, the semiconductor device comprises a covering layer that covers at least one part region of the semiconductor thin film and covers at least one part of electroconductive member connecting with the semiconductor thin film devise elements.

A second aspect of the invention is to provide an optical print head comprising a semiconductor device which is formed by using semiconductor thin film bonded by intermolecular force on the substrate, wherein the semiconductor device includes a covering layer that covers at least one part region of the semiconductor thin film and covers at least one part of electroconductive member connecting with the semiconductor thin film.

A third aspect of the invention is to provide an image forming apparatus, the image forming apparatus comprises an optical print head which includes a semiconductor device formed by using semiconductor thin film bonded by intermolecular force on the substrate, wherein the semiconductor device has a covering layer that covers at least one part region of the semiconductor thin film and covers at least one part of electroconductive member connecting with the semiconductor thin film.

EFFECT OF THE PRESENT INVENTION

According to the invention, because the invention provides covering layer which covers at least a part of region of semiconductor thin-film bonded by intermolecular force on the intermolecular force on the substrate and covers at least a part of electrodes and/or wirings connected to the above stated semiconductor thin-film, so it is possible to reduce the occurrence probability of defect in the semiconductor thin film in the fabrication process in which a semiconductor wafer is cut off by scraper or dicing saw and so on. Further, because thick-film layer of coating material used for covering semiconductor thin-film is provided except pn connecting region (light emitting region), so it is possible to not produce bad influence to the light come from light emitting section. As a result, light emitting region can be protected.

The above and other objects and features of the present invention will become apparent from the following detailed description and the appended claims with reference to the accompanying drawings.

BRIEF DSCRIPTION OF THE DRAWINGS

DETAILED DESCRIPTION OF THE PREFERRED EMBODIMENTS

Best embodiments of the invention will be described in detail hereinbelow with reference to the drawings.

According to the invention, in a semiconductor device in which semiconductor thin-films having semiconductor device elements are bonded by intermolecular force on the substrate, the invention can protect semiconductor thin-film and thin-film device element through providing a covering layer which covers the semiconductor, thin film so as to protect the semiconductor thin-film, and can offer the semiconductor device which has a structure with high reliability.

Embodiment 1

Figure 1:
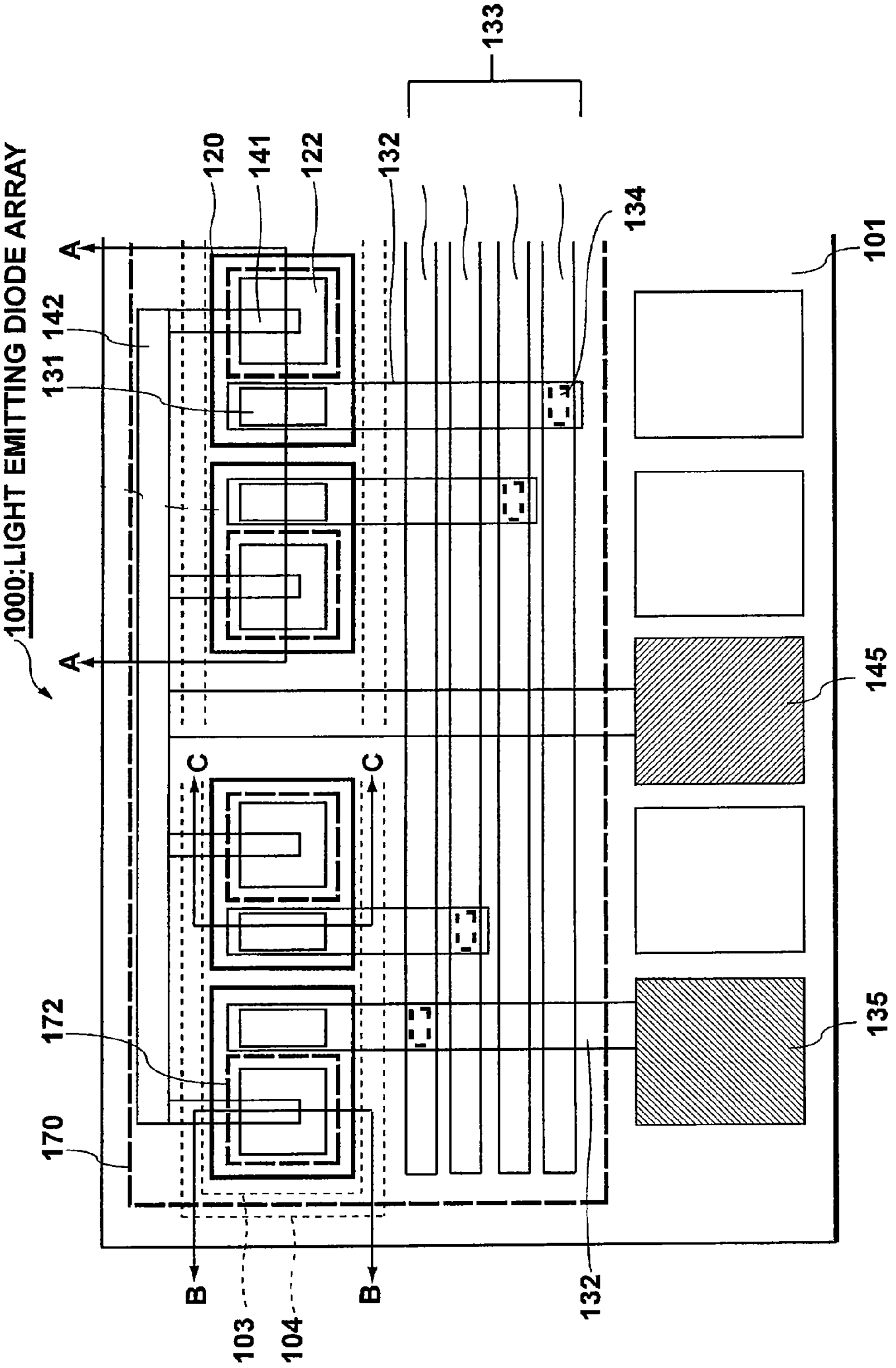
FIG. 1 is a planform of a semiconductor device in embodiment 1 of the present invention.

Explanations (for aspect and manufacturing method):

FIG. 1 is a planform of a semiconductor device in embodiment 1 of the present invention.

As shown in FIG. 1, light emitting diode array, as a semiconductor device in embodiment 1, is fabricated through bonding light emitting diode formed of semiconductor thin-film bonded by intermolecular force without any adhesives onto a Si—IC wafer. The light emitting diode array shown in FIG. 1 is drawn to show the featuring points of the invention and make the invention point clear, and size relation shown in FIG. 1 does not limit the invention.

As shown in FIG. 1, 101 is a substrate of a Si—IC wafer. 103 is a metal layer. 104 is a smoothing layer to prepare nanometer-order flattened bonding surface. 120 is a semiconductor thin-film. 122 is a light emitting region of light emitting diode. 131 is a first conductive type side electrode. 141 is a second conductive type side electrode. 132 is a first conductive type side wiring, it is connected with Si—IC via the first conductive type side connection pad 135. 142 is a second conductive type side wiring, it is connected with Si—IC via the second conductive type side connection pad 145. 133 is a common wiring with respect to the first conductive type side electrode. 134 is a wiring connecting region to connect the common wiring 133 and respective wirings 132.

Light emitting diode array 1000 is an example of light emitting diode array which is controlled to lighten with a method of time division drive. Light emitting diode array 1000 represents light emitting diode array corresponding with four division drive. By comparison with the point of the invention, such as arrangement of light emitting diode array, driving method, wiring form, connection form with Si—IC and so on, many kinds of changes are possible, so the invention is not be limited. 170 is a covering film for covering semiconductor thin film. 172 is a covering film opening portion representing the open region of the covering film. The covering film opening portion 172 is desired to open in the circumference region of the light emitting section.

Figure 2:
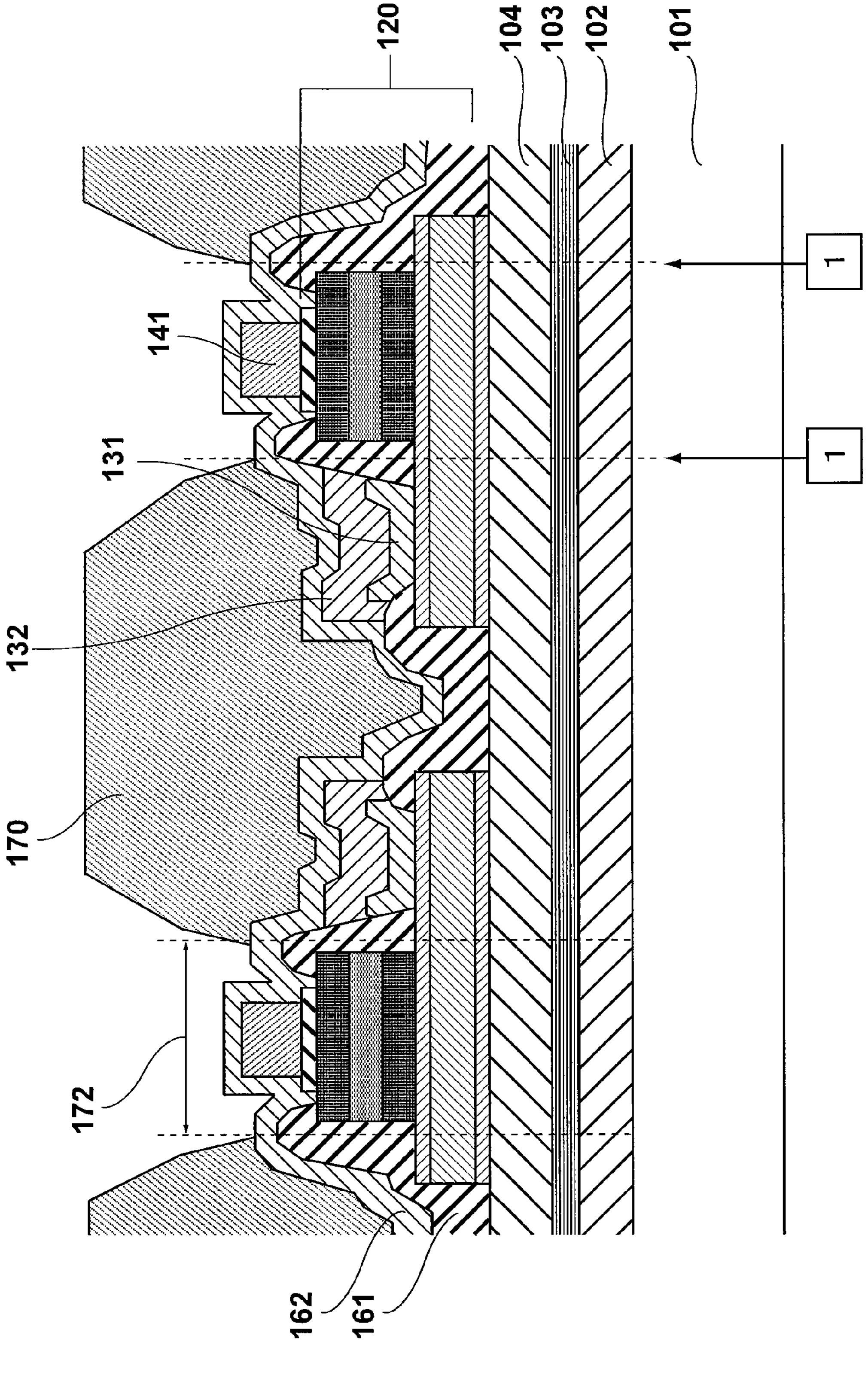
FIG. 2 is a cross section of A-A arrow in FIG. 1.

FIG. 2 is a cross section of A-A arrow in FIG. 1.

As shown in FIG. 2, the driving IC is furnished on the substrate 101 to drive the light emitting diode. 102 is an IC formation region in the Si—IC wafer. The metal layer 103 is a reflecting layer which reflects light emitted from the light emitting diode. The metal layer 103 is formed on the passivation film (insulation film) serving as an uppermost layer of the IC wafer, by metal layer deposition method/lift-off method. The metal layer is formed at least on the semiconductor thin film bonding plan region of semiconductor insulation film surface.

A smoothing layer 104, for example, is a coating material layer. The smoothing layer is formed to provide nanometer order flat surface at least at the semiconductor thin film bonding region above cover the metal layer 103. For example, the smoothing layer pattern is formed spin coating of photosensitive material by photography process. Semiconductor thin-film 120 consists of semiconductor epitaxial growth layers providing semiconductor device element.

The semiconductor thin film 120 is formed a mother substrate which is other than the substrate the substrate 101 on by, for example, OMCVD (organic metallic chemistry vapor deposition) method. In the formation process of the semiconductor thin film 120, a sacrificial layer is epitaxially grown on the GaAs substrate, and the semiconductor thin film layer is grown on the sactificial layer. The semiconductor layer may consist of stacking semiconductor layers (hereto eptiaxial layers). The semiconductor thin film 120 is peeled of it from the GaAs substrate by selective etching of the sacrificial layer that is formed between the GaAs substrate and the semiconductor thin film layer. The peeled semiconductor thin film layer 120 is bonded by intermolecular force with out any adhesives on the smoothing layer 104. After bonding of the peeled semiconductor thin film layer 120, the semiconductor thin film is processed to form light emitting diode array.

161 is an interlayer insulation film. The interlayer insulation film 161 can be formed with, for example, coating film. Photosensitive coating film is coated by spin-coat method, and an appointed pattern is formed by photolithography process. First conductive type side electrode 131 is preferably formed of materials chosen from AuGe/Ni/Au, AuGeNi/Au. Second electro-conductive side electrode 141 is preferably formed of material chosen from Ti/Pt/Au, Al, Ni/Al, Au/Zn. First conductive type side wiring 132 is formed of materials chosen from Ti/Pt/Au, Al, Ni/Al and so on.

Respective electrodes and wirings are formed by standard metal layer deposition method/lift-off method. 162 is passivation film, it is insulation film which covers the semiconductor thin film 120, electrodes 131, 141, and first conductive type side wiring 132. The passivation film 162 at least covers the opening portion of interlayer insulation film 161 on the light emitting region. The passivation film 162 is formed by using SiN film and using a method of plasma CVD.

A covering film 170 is formed of coating material (an organic material). The thickness of the covering film 170 is in the range from 1 μm to 10 μm. Coating material having curing temperature equal and below 350 degrees, more preferably equal and below 250 degrees, is desired to be used as the covering film 170 in order to achieve area semiconductor thin film bonding state by avoiding the influence of stress. Good bonding state means that no crack and no pealing off appear on the bonded semiconductor thin film. A part of edges of the opening portion 172 are preferably on the opening portion semiconductor thin film and near to the light emitting region. The edge of the opening portion shown by "1" surrounded by square in FIG. 2 is desired to be in a position to cover the opening portion of the first conductive type side electrode opening portion, but not to cover the side part of the light emitting region.

Figure 3:
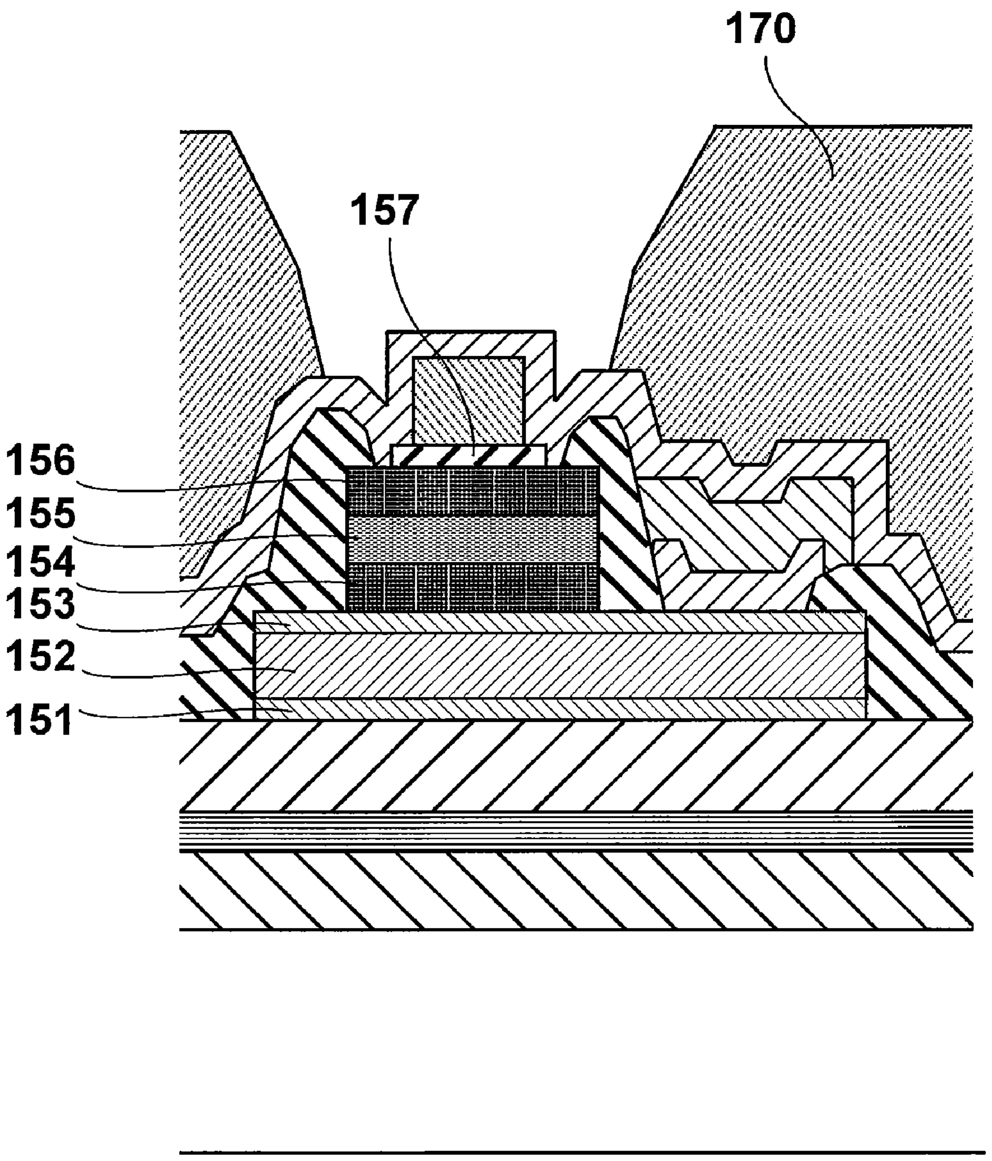
FIG. 3 is a cross section showing a semiconductor accumulation layer structure in embodiment 1 of the present invention.

FIG. 3 is a cross section showing the semiconductor stacking layer structure in the embodiment 1.

FIG. 3 is representing left part of the cross section shown in FIG. 2. As shown in FIG. 3, 151 is a bonding layer formed of n-GaAs layer. 152 is a conductive layer formed from n-Al- $_t$Ga$_{1-t}$As layer. 153 is a first conductive type side contact layer formed from n-GaAs layer. 154 is a cladding layer formed of n-Al$_x$Ga$_{1-x}$As layer. 155 is an active layer formed of n-Al$_z$Ga$_{1-z}$As layer. 157 is a second conductive type side contact layer formed of p-GaAs layer. The Al composition ratio of respective semiconductor layers at least hold a relation of t, x, z>y.

Figure 4:
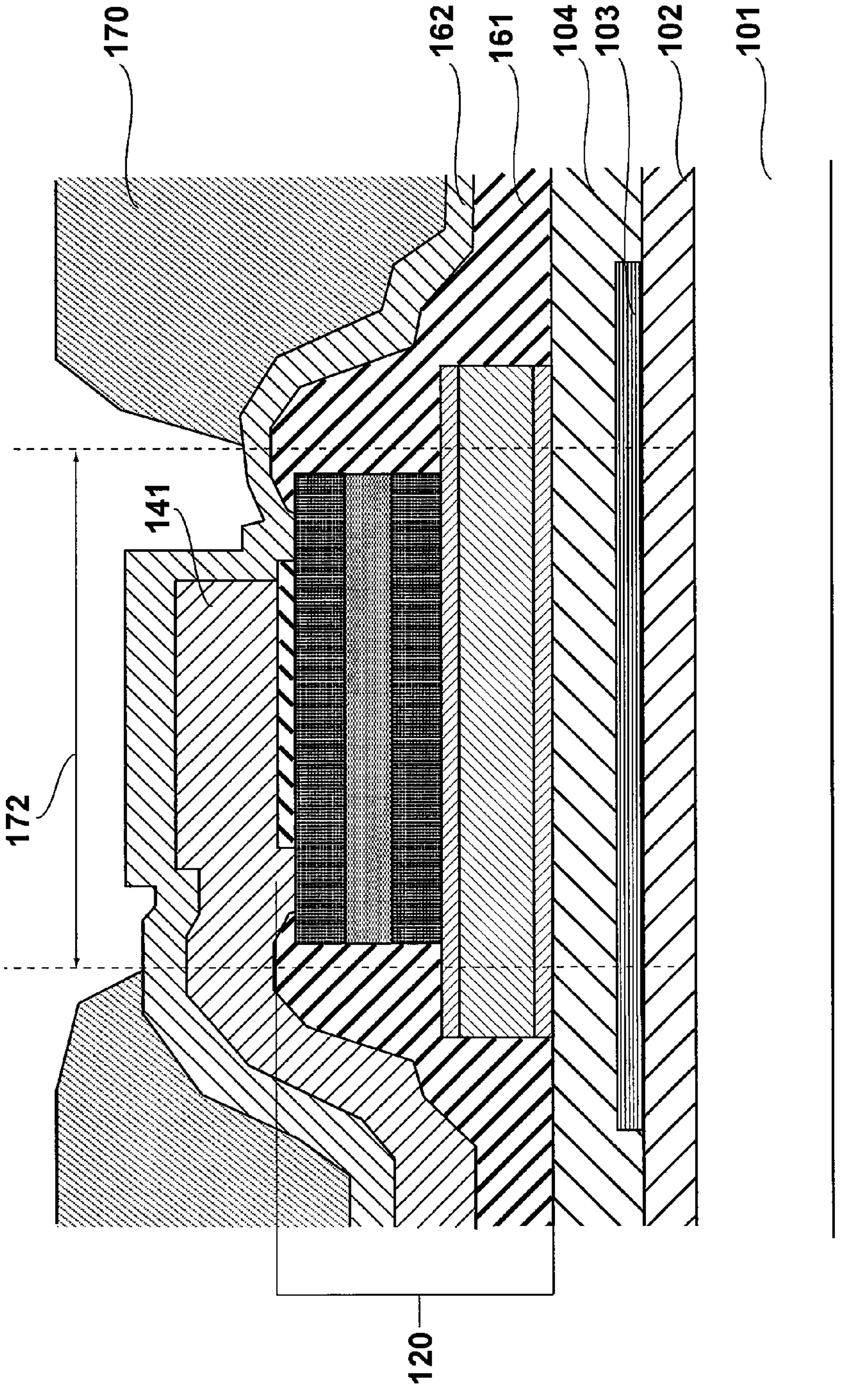
FIG. 4 is a cross section of B-B arrow in FIG. 1.

FIG. 4 is the cross section of B-B arrow in FIG. 1.

As shown in FIG. 4, the edge of the opening portion 172 of the covering film 170 is covers at least a part of semiconductor thin film, but does not the light emitting region.

Figure 5:
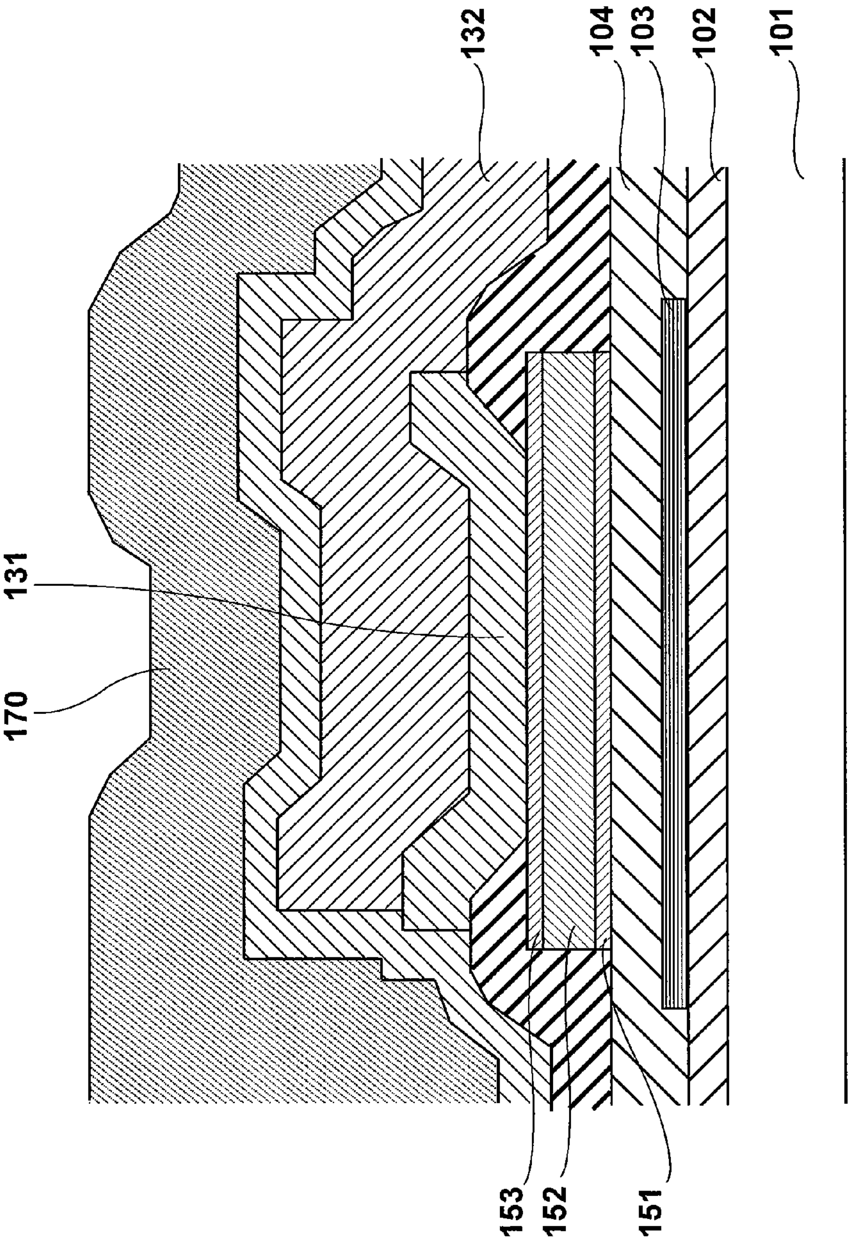
FIG. 5 is a cross section of C-C arrow in FIG. 1.

FIG. 5 is the cross section of C-C arrow in FIG. 1.

As shown in FIG. 5, the covering layer is formed of photosensitive coating material by using spin-coating method; after baking the coating material at a proper temperature and for a proper time, the coating material is exposed using photomask pattern such as an opening portion to exposing and developed; and the developed coating material is cured at a proper temperature and for a proper time.

As the above description, in the embodiment, the covering film 170 functions as the protection layer for the semiconductor thin film 120. The covering layer covers the semiconductor thin film having edges of the opening portion 172 close to the light emitting region, because protection of the light emitting region is critical to achieve high reliability of the light emitting diode. Because the emitted light power will be reduced if the covering film 170 covers the light emitting region, and it will give bad influence on light emitting characteristics. The opening portion 172 is formed on the light emitting region so as to prevent bad influence for the light characteristic.

Explanation of effect:

According to the embodiment, in the semiconductor thin film light emitting diode which is bonded on the substrate 101 by intermolecular force, because the thick film layer of the coating material covers the semiconductor thin film, and does not cover the light emitting section. It is possible to protect the light emitting region and achieve uniform light emitting power distribution in the thin film light emitting diode array; the coating material has no effect on the light emitting characteristics e.g. decreasing of light emitted power.

The next is a description about a transformation example in embodiment 1.

In FIG. 1, covering film 170 extends to the vicinity of the connection pad, but the edge of the conveying film 170 may be suitably positioned at the other region. Further, according to the description of the embodiment 1 (aspect and method of manufacturing), the semiconductor stacking layer structure and semiconductor material can be changed properly. It is also possible to use semiconductor material, for example, four-elements compound semiconductor material such as AlGaInP, InGaAsP, and nitride compound semiconductor material such as GaN, InGaN. It is also possible to use individual light emitting diode, instead of using plural light emitting diodes. Further, in FIG. 1, the plural light emitting diode are arrayed in a row, but the position relation of respective light emitting diodes can also be changed properly. Moreover, not only one-dimensional array but also two-dimensional light emitting diode array can be used. In the embodiment, as the semiconductor element in the semiconductor thin film, light emitting diode is described as an example, but sensor element such as light receiving element can also be used.

Figure 6:
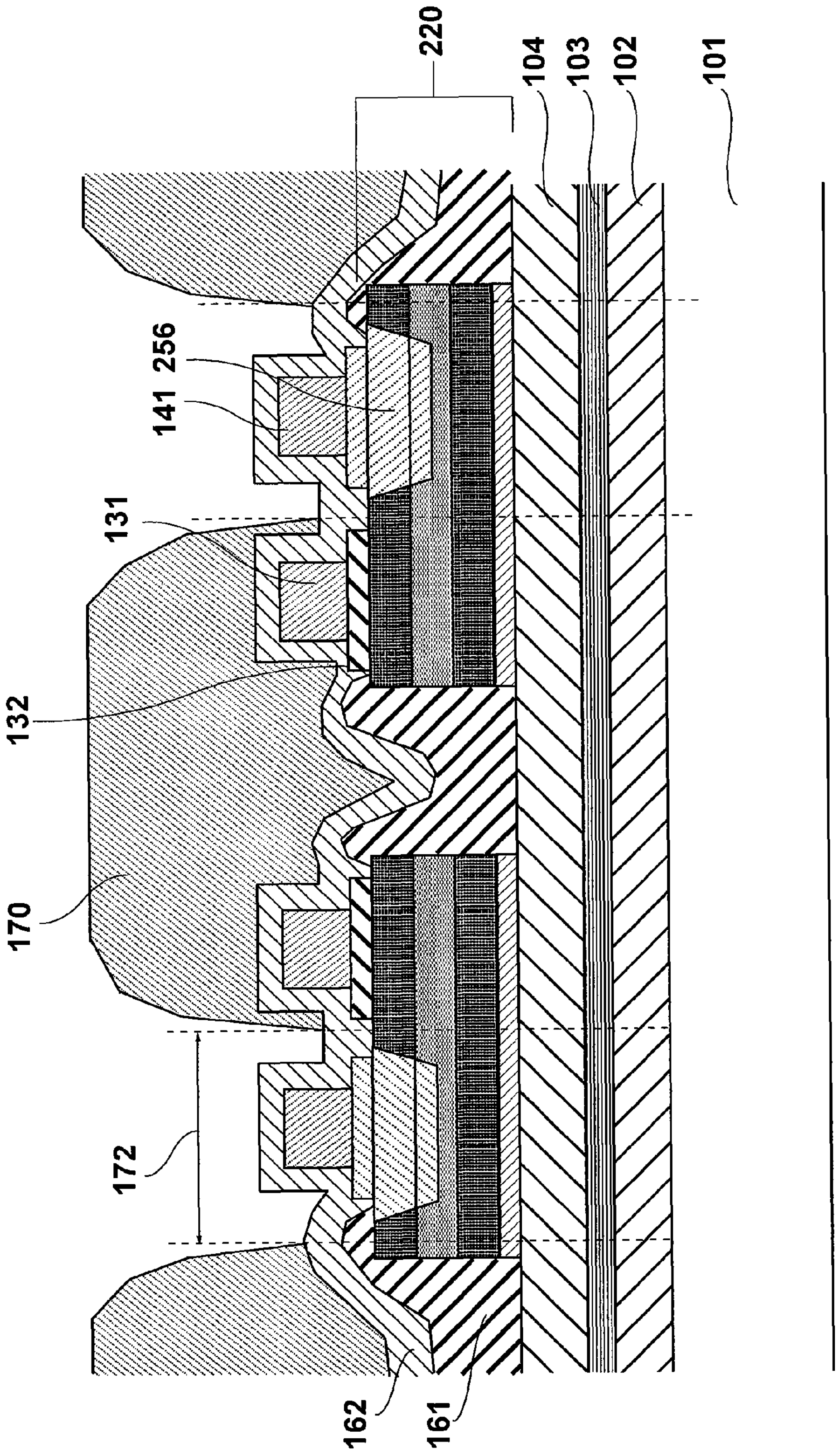
FIG. 6 is a diagram for explaining a transformation example of semiconductor device in embodiment 1 of the present invention.

FIG. 6 is a diagram for explaining a transformation example of semiconductor device in embodiment 1 of the present invention.

As shown in FIG. 6, a semiconductor thin film 220 is an example that the semiconductor thin film device is formed by impurity diffusion into pn into the semiconductor thin film layer to form junction. The same symbol for the same component in FIG. 1 to FIG. 5. is indicated in FIG. 6 In FIG. 6, 220 is the semiconductor thin film. 256 is an impurity diffusion region. In the impurity diffusion region 256, second conductive type impurity is selectively diffused to the first conductive type semiconductor epitaxial layer. According to FIG. 6, the covering film 170 is furnished so as to form an opening portion 172 on the circumference of diffusion region 256 without covering the region of the diffusion region 256.

Figure 7:
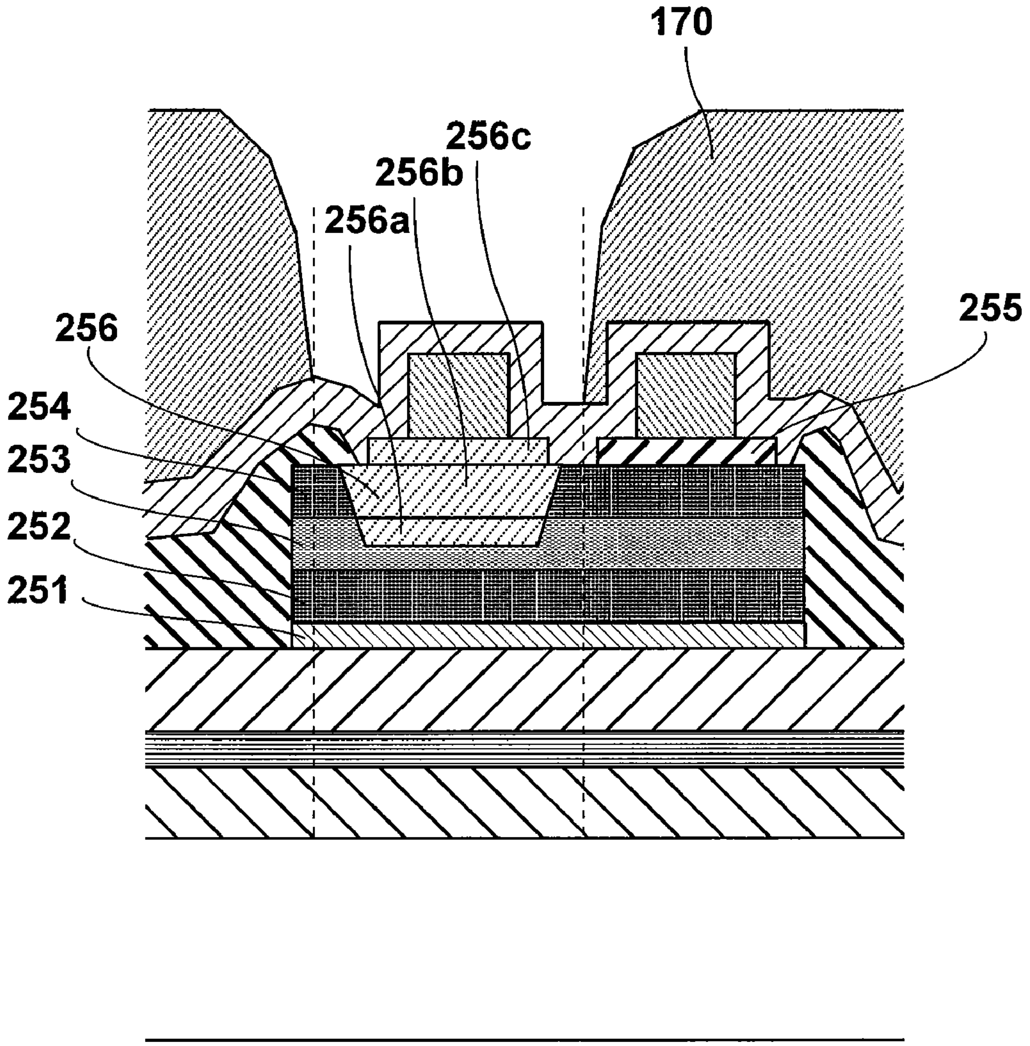
FIG. 7 is a cross section of semiconductor accumulation layer structure in a transformation example of semiconductor device in embodiment 1 of the present.

FIG. 7 shows a cross section of the semiconductor stacking layer structure showing a transformation example of semiconductor device in embodiment 1 of the present.

In FIG. 7, 251 indicates a bonding layer formed by using n-GaAs layer. 252 indicates a cladding layer formed by using n-Al$_x$Ga$_{1-x}$As layer. 253 indicates an active layer formed by using n-Al$_y$Ga$_{1-y}$As layer. 254 indicates a cladding layer formed by using n-Al$_z$Ga$_{1-z}$As layer.

255 indicates a contact layer formed by using n-GaAs layer. 256 is an impurity the diffusion layer formed by using selective Zn diffusion. The front of diffusion region should be located at least in the active layer 253. 254 indicates a cladding layer formed by using the n-Al$_z$Ga$_{1-z}$As layer. 255 indicates a contact layer formed by using the n-GaAs layer. 256 is an impurity diffusion layer formed by using selective Zn diffusion. The front of diffusion is located at least in the active layer 253.

In the diffusion region of the semiconductor layer, **256*a* indicates a p-type active layer. 256*b* is a p-type cladding layer. 256*c* is a p-type contact layer. The Al composition ratio of respective semiconductor layers should at least hold a relation of t, x, z>y. Then, the pn junction region formed in the GaAs contact layer is removed, and the p-type GaAs contact layer 256 and the n-type GaAs contact layer 255** is isolated. Furthermore, the embodiment 1 represents the semiconductor thin-film bonded by inter molecular force on the Si-IC wafer. But, the IC wafer is not limited to the IC wafer in the transformation example, it is also possible to use other material substrate then the Si—IC substrate.

Embodiment 2

Figure 8:
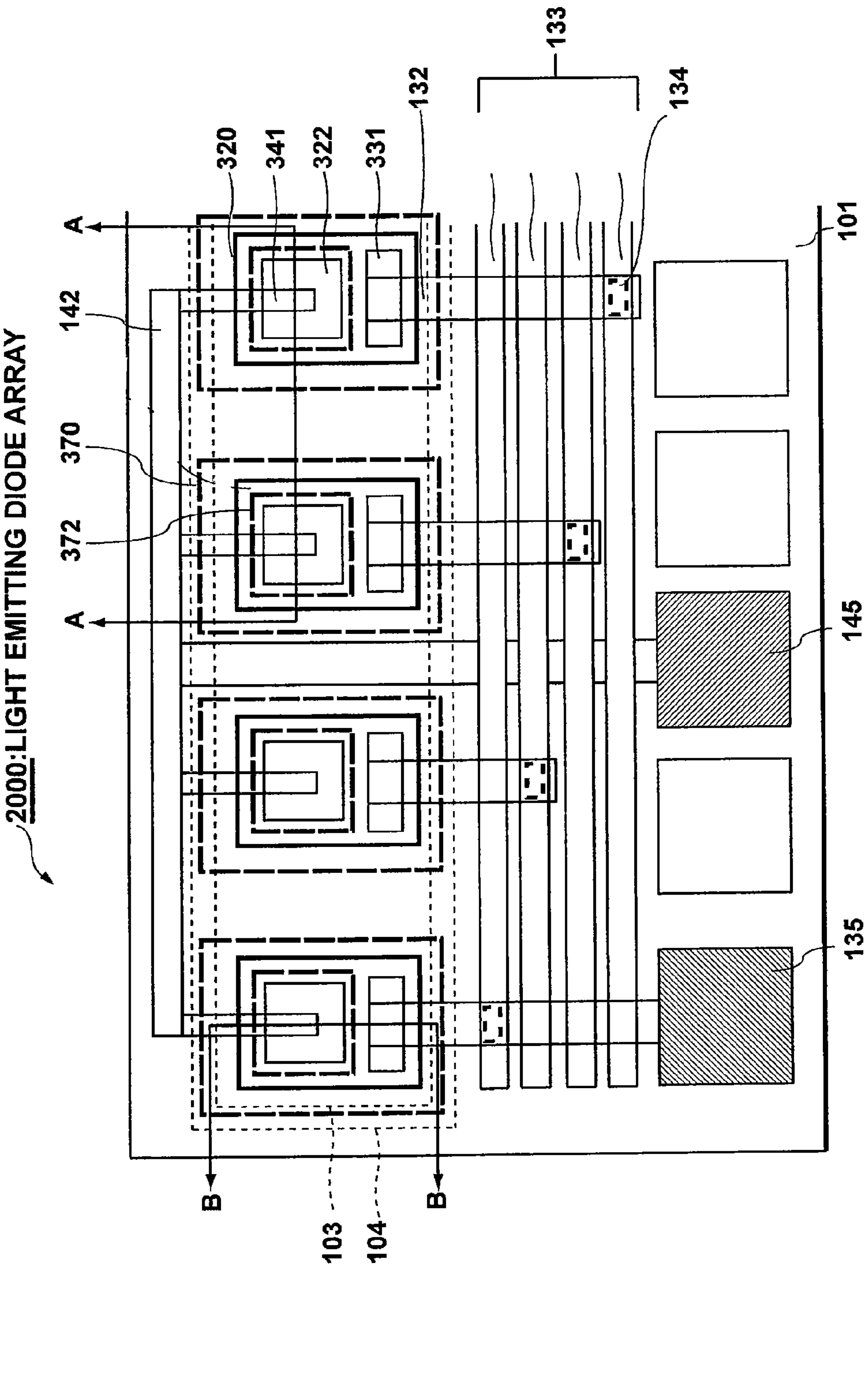
FIG. 8 is a planform of a semiconductor device in embodiment 2 of the present invention.

Explanation of Aspect:

FIG. 8 is a planform of a semiconductor device in embodiment 2 of the present invention.

The difference between the light emitting diode array 1000 shown in FIG. 1 in embodiment 1 and the light emitting diode array 2000 in FIG. 8 that covering layer 370, which covers semiconductor thin film, is separated at division region of the semiconductor thin film in the embodiment 2. In the following description, about the explanation of the same section in embodiment 1 will be omitted by using the same symbol in the embodiment 1.

In FIG. 8, 320 indicates a semiconductor thin film. The semiconductor thin film 320 is bonded by intermolecular force on the substrate 101 of Si—IC wafer. In FIG. 8, the first conductive type side electrode 331 is located between the light emitting region 322 and the common wirings 133, but the position relation at the electrode 331 to the light emitting region 322 is not limited to the layout shown in FIG. 8. For example, so shown in the embodiment 1, the elctrode 331 may be formed between each light emitting region 322 in the light emitting region array.

As shown in FIG. 8, the covering layer 370 is divided into plurality of isolated coring layer and each isolated covering layer covers each thin film 320. The opening portion of respective covering layers 370 on the semiconductor thin film 320, and does not cover the light emitting region 322.

Figure 9:
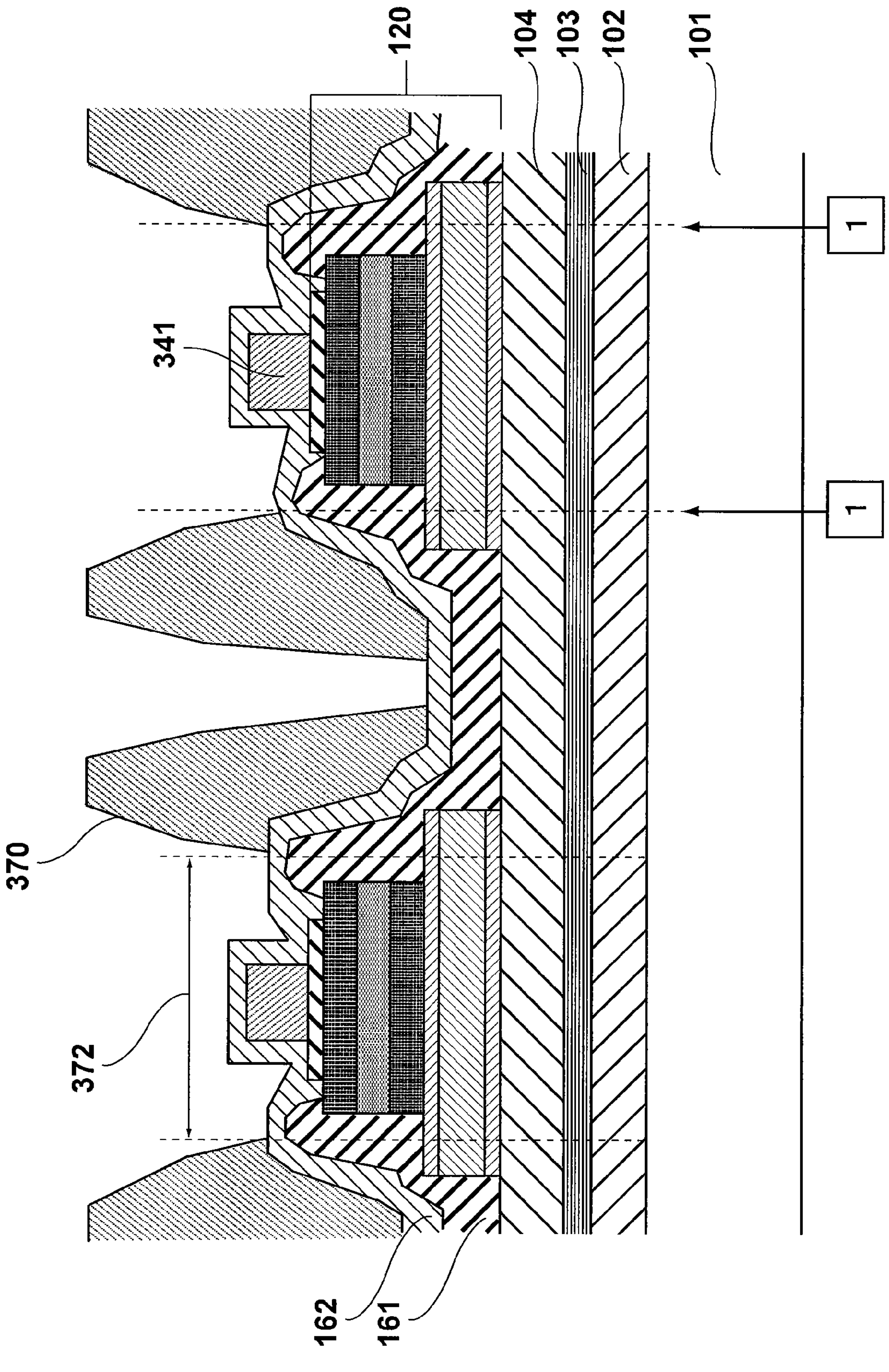
FIG. 9 is a cross section of A-A arrow in FIG. 8.

FIG. 9 is the cross section at A-A arrow in FIG. 8.

As shown in FIG. 9, the covering layer 370 is divided into a plurality of isolated covering layers to cover each isolated thin film of light emitting diode array. 341 indicates the second electro-conductive side electrode of embodiment 2 of the present invention.

Figure 10:
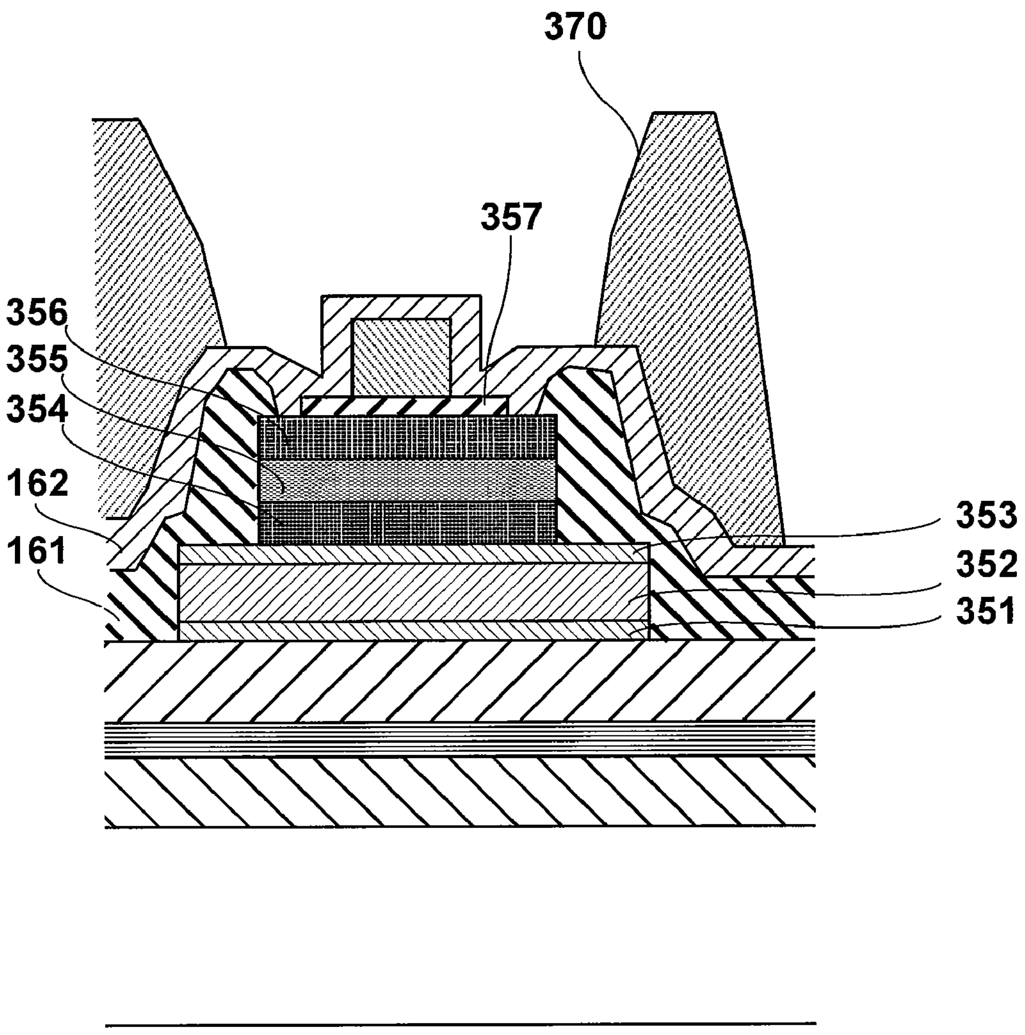
FIG. 10 is a cross section showing a semiconductor accumulation layer structure in embodiment 2 of the present invention.

FIG. 10 is a cross section showing a semiconductor stacking layer structure in embodiment 2 of the present invention.

As shown in FIG. 10, the difference between the cross section in FIG. 10 and the FIG. 3 in embodiment 1 is that the covering film is divided into isolated covering films 370 in FIG. 10 and each covering film 370 covers each semiconductor thin film, but the covering film 170 covers plurality of semiconductor thin films. Thin film layer structure indicated by symbols from 351 to 357 in FIG. 10 is equals to the thin film layer structure indicated by symbols 151 to 157 in FIG. 3 in order.

Figure 11:
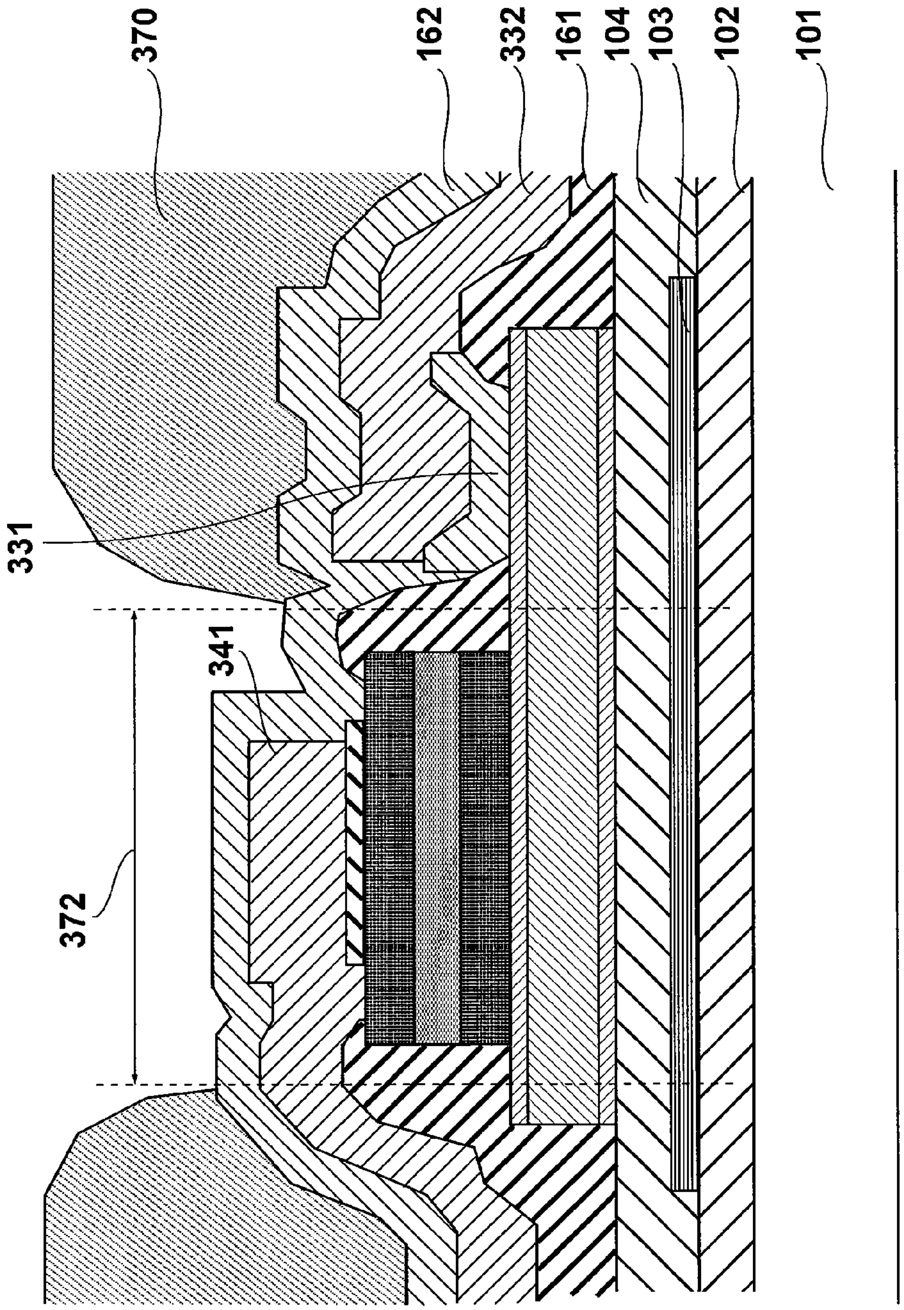
FIG. 11 is a cross section of B-B arrow in FIG. 8.

FIG. 11 is a cross section of B-B arrow in FIG. 8.

As shown in FIG. 11, the covering layer 370 covers first conductive type side electrode and wiring on the semiconductor thin film, at least the light emitting region is not covered by the covering layer 370. The opening portion of covering layer 370 is located in the circumference of the light emitting region.

Explanation of Effect:

According to the embodiment, as the above stated description, as the additional effect other than the effect at the embodiment, the covering layer, which covers the semiconductor thin film, and is separated to cover individual semiconductor thin film, reduce the influence of the stress due to the covering layer on the semiconductor thin film. The function of covering layer 370 is the same as the covering film 170 in embodiment 1. That is to say, covering layer 370 has the function of protecting the semiconductor thin film 320. After ensuring the reliability of the light emitting diode, the light emitting region is an important region, so the opening portion 372 covers the semiconductor thin film in the vicinity of the light emitting region. If the covering layer 370 covers light emitting region, there will be no bad influence to the light emitting feature such as the reduction of emitted light power.

The next is a description about the transformation example in embodiment 2.

Figure 12:
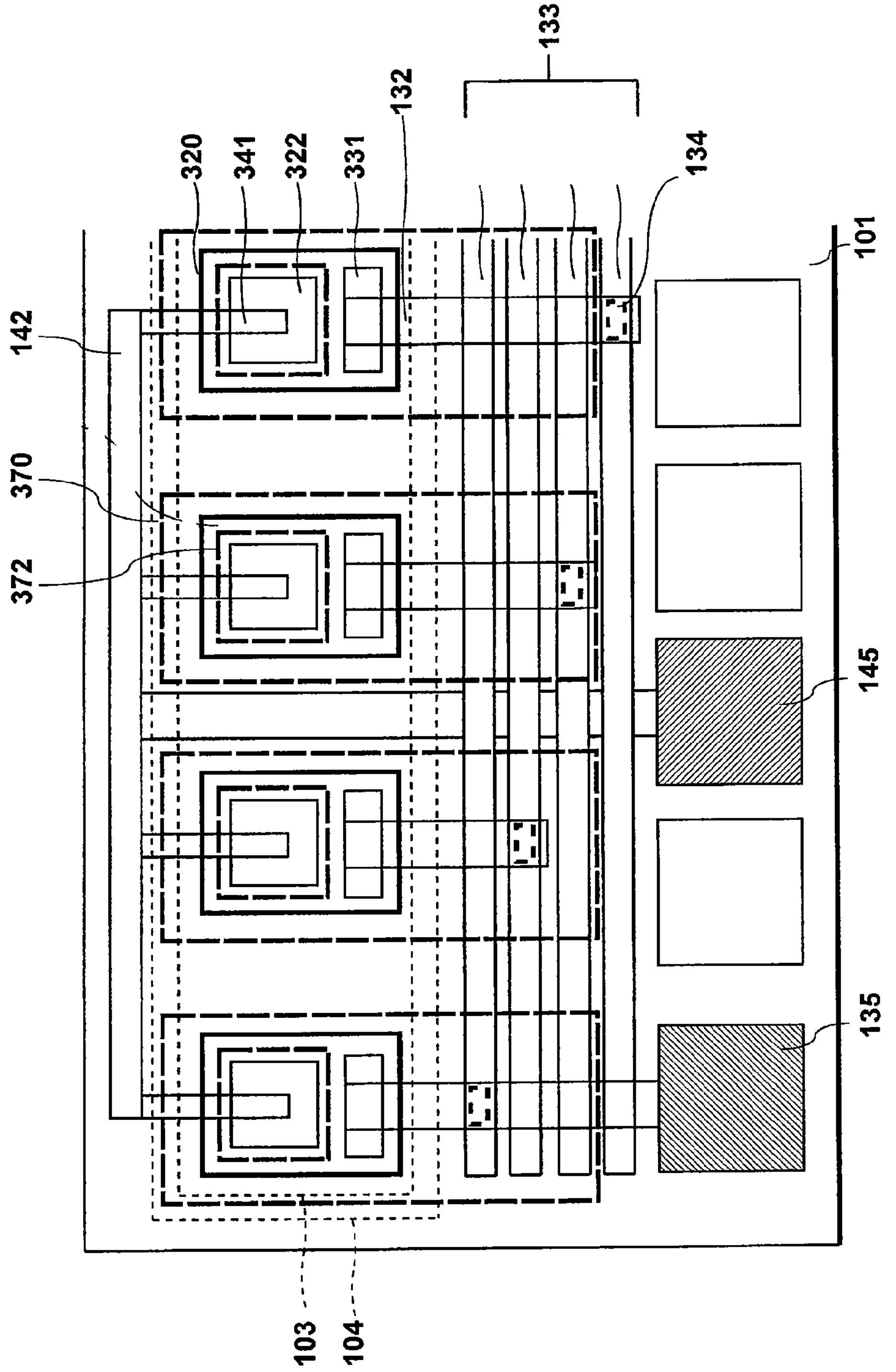
FIG. 12 is a diagram for explaining a transformation example (1) of semiconductor device in embodiment 2 of the present invention.

FIG. 12 is a diagram for explaining a transformation example (1) of semiconductor device in embodiment 2 of the present invention.

As shown in FIG. 12, it is possible for the covering layer 370 to extend to the neighborhood of a connection pad 135 and a connection pad 145.

Figure 13:
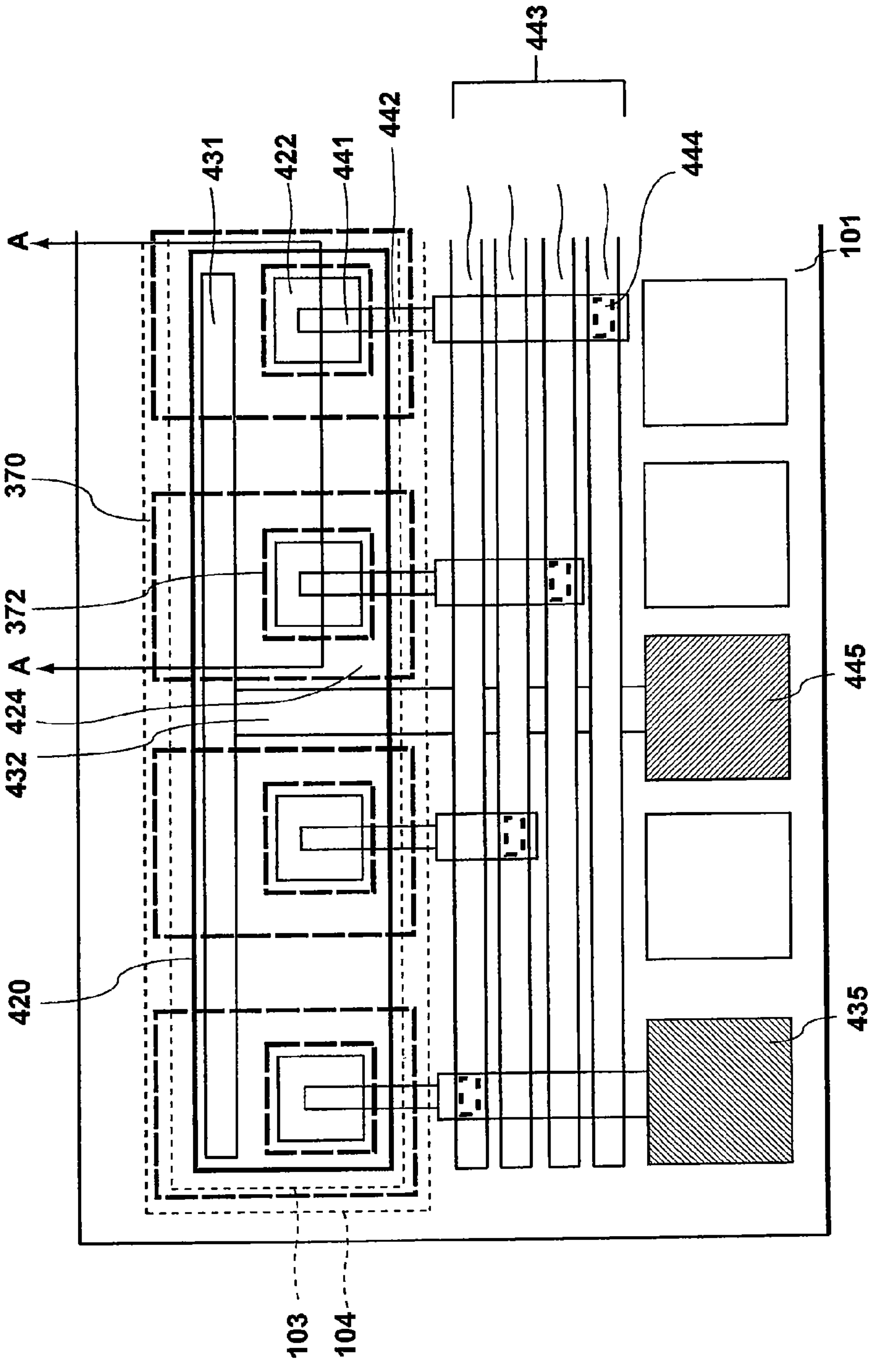
FIG. 13 is a diagram for explaining a transformation example (2) of semiconductor device in embodiment 2 of the present invention.

FIG. 13 is a diagram for explaining a transformation example (2) of semiconductor device in embodiment 2 of the present invention.

As shown in FIG. 13, the first conductive type side region of semiconductor thin film 420 and a plural second conductive type side region (light emitting region) 442 is not be separated and as a common layer to be a form of an organic whole. As shown in FIG. 13, 441 indicates second electro-conductive side electrode, 442 indicates second conductive type side wiring, 443 indicates a common wiring. The second conductive type side wiring 442 indicates connecting with plural second conductive type side electrode. 444 is connection region between the second conductive side wiring 442 and the common wiring 443. The second conductive type side wiring 442 is connected with common wiring 443 at the connection region 444. 431 is first conductive type side electrode. The first conductive type side electrode 431 is formed on the first conductive type side contact layer 424. 432 indicates a wiring. The first electro-conductive side electrode 431 is connecting the first conductive type electrode 431 with a connection pad 445. 435 indicates second conductive type side connection pad. The opening portion 372 the of covering layer 370 is furnished in the light emitting region 422.

Figure 14:
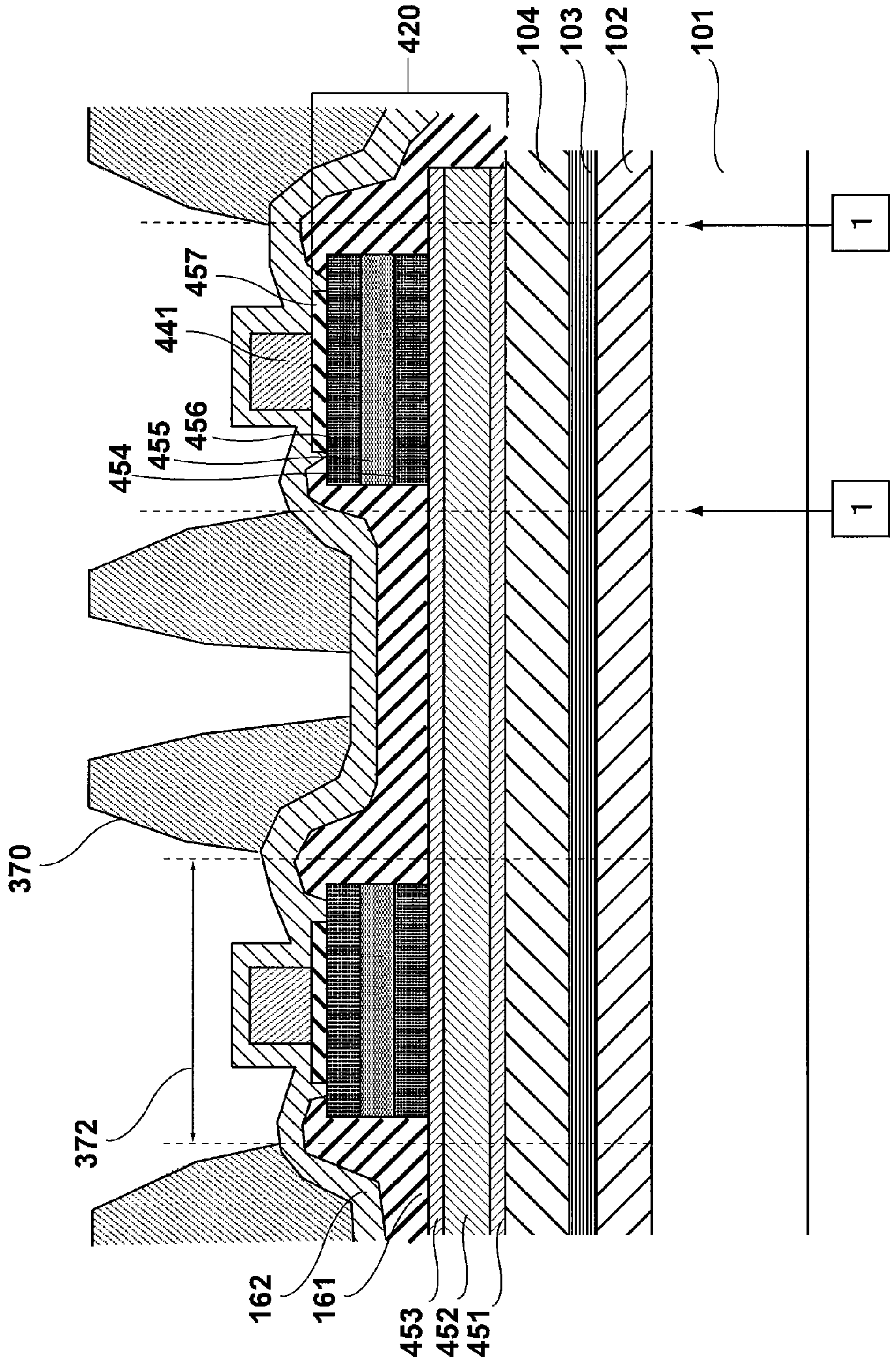
FIG. 14 is a cross section of A-A arrow in FIG. 13.

FIG. 14 is the cross section at A-A arrow in FIG. 13.

The respective semiconductor layers of 451, 452, 453, 454, 455, 456, 457 comprising the semiconductor thin film 420, shown in FIG. 14, can be formed using the same preferable materials described as the semiconductor layers of 151, 152, 153, 154, 155, 156, 157 stated in embodiment 1.

Figure 15:
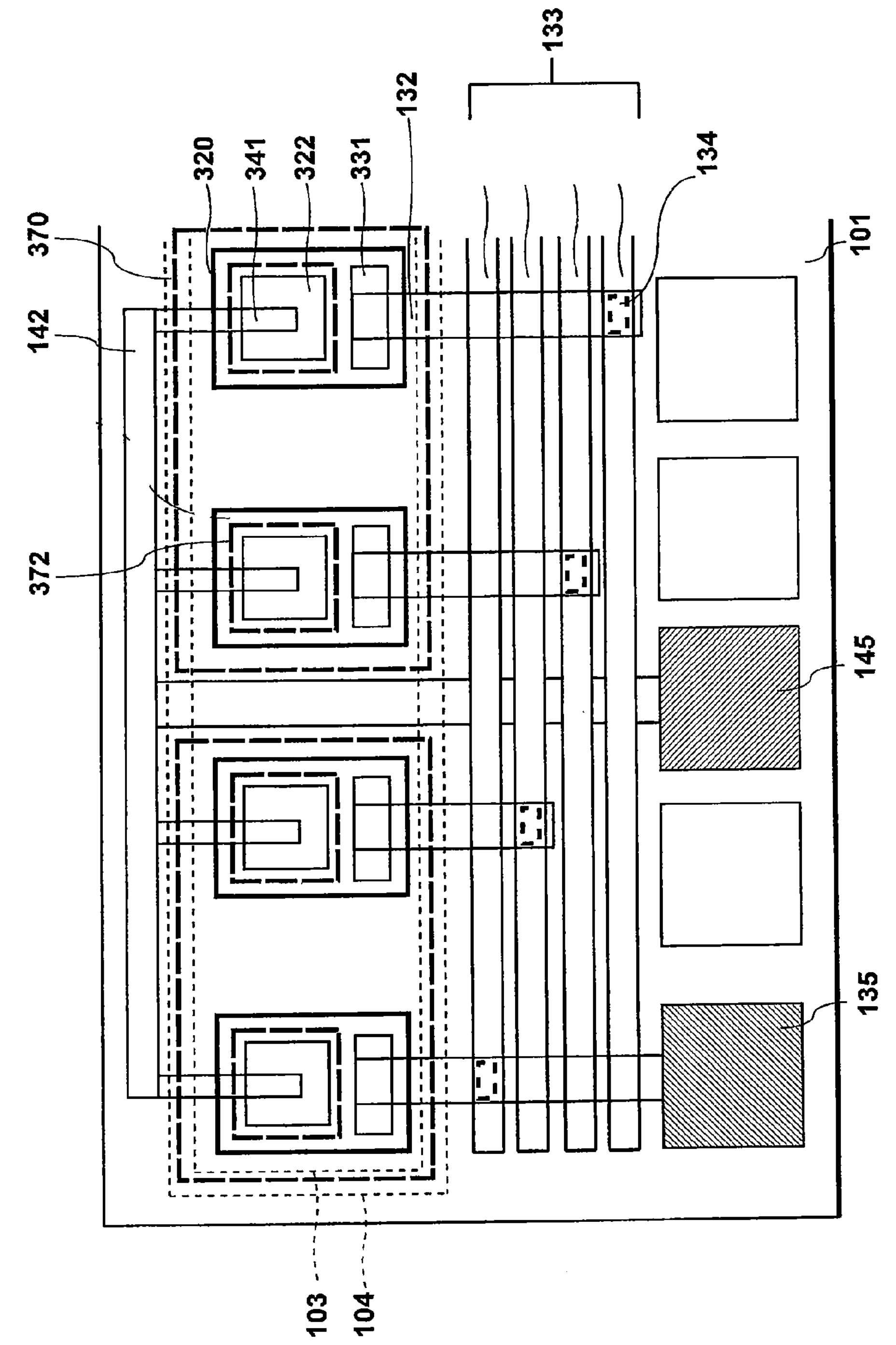
FIG. 15 is a diagram for explaining a transformation example (3) of semiconductor device in embodiment 2 of the present invention.

FIG. 15 is a diagram for explaining a transformation example (3) of semiconductor device in embodiment 2 of the present invention.

As shown in FIG. 15, in the dividing form of the covering layer which covers the semiconductor thin film, the covering layer 370 is formed through extending over plural semiconductor thin film or plural light emitting region. Further, many kinds of transformation containing the transformation example stated in embodiment 1 is possible.

Embodiment 3

Explanation of Aspect:

The difference between the light emitting diode array 3000 in the embodiment and light emitting diode array 1000 in embodiment 1, light emitting diode array 2000 in embodiment 2 is that according to light emitting wavelength, on the light emitting diode array 3000, the semiconductor thin film containing the light emitting region is covered by transparent coating film (organic material film).

Figure 16:
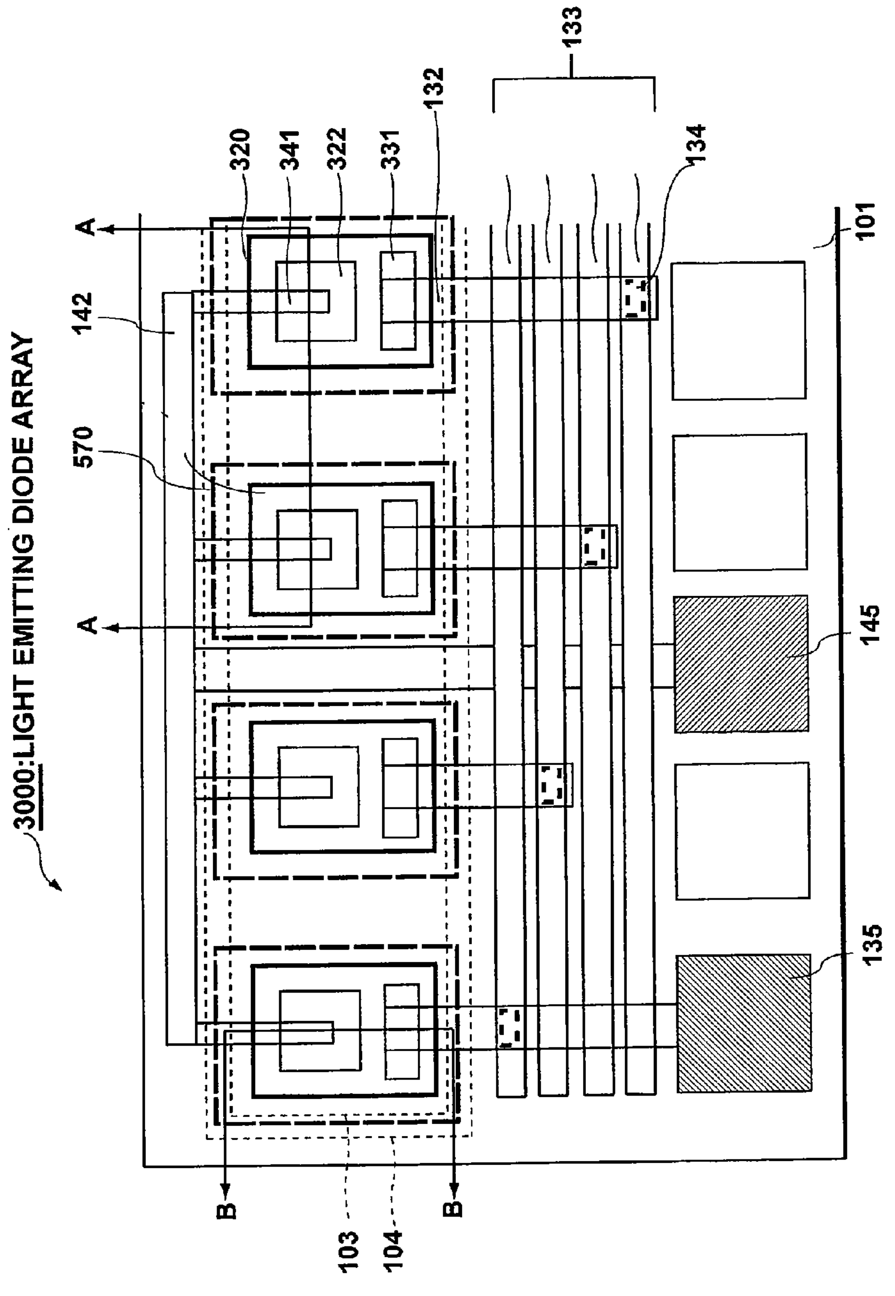
FIG. 16 is a planform of a semiconductor device in embodiment 3 of the present invention.

FIG. 16 is a planform of a semiconductor device in embodiment 3 of the present invention.

The following is an explanation about the differences in the light emitting diode array 3000 from the light emitting diode array 1000 and light emitting diode array 2000. For the same section in the light emitting diode array 3000 as the light emitting diode array 1000 and light emitting diode array 2000, the same symbol will be used in the light emitting diode array 3000 as the light emitting diode array 1000 and the light emitting diode array 2000, and the explanation of the same sections will be omitted.

As shown in FIG. 16, 570 indicates a covering layer. The covering layer 570 covers semiconductor thin film 320 and covers also the light emitting region 322. The covering layer 570 consists of a transparent thin film which is transparent to the light emitting wavelength.

Figure 17:
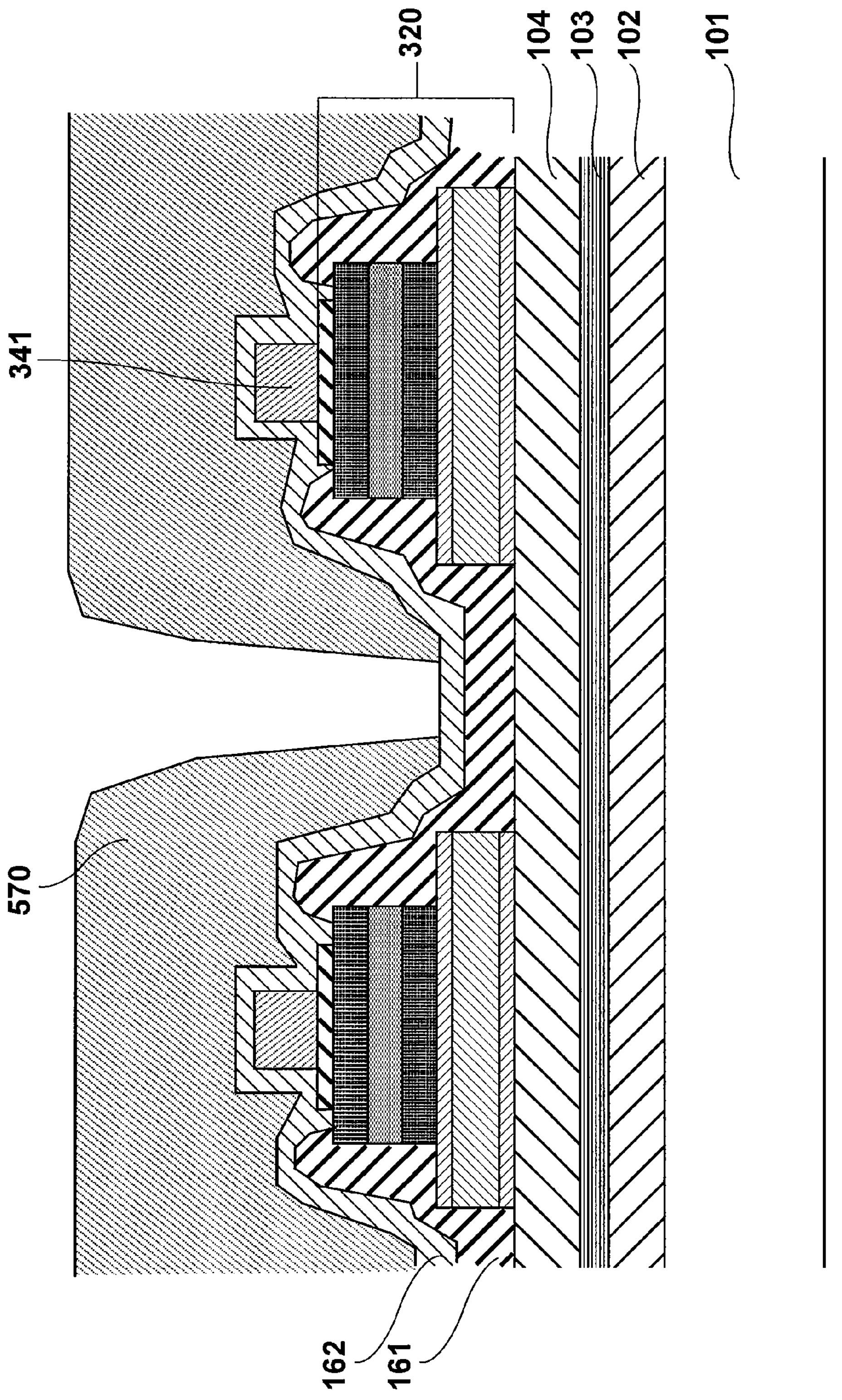
FIG. 17 is a cross section of A-A arrow in FIG. 16.

FIG. 17 is the cross section at A-A arrow in FIG. 16.

As shown in FIG. 17, the covering layer 570 covers the light emitting region and is separated to cover separately respective semiconductor thin films 320.

Figure 18:
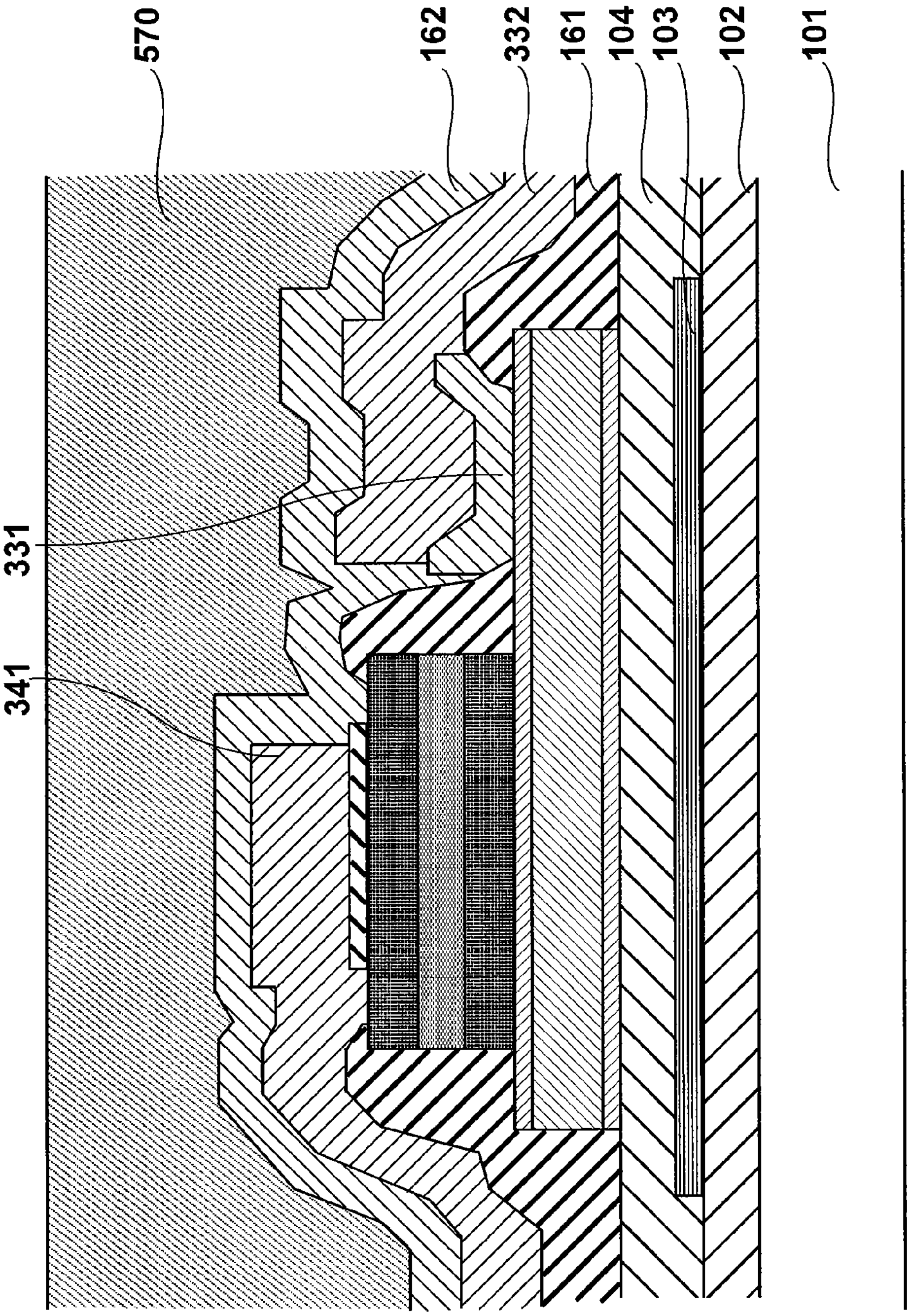
FIG. 18 is a cross section of B-B arrow in FIG. 16.

FIG. 18 is the cross section at the B-B arrow in FIG. 16.

As shown in FIG. 18, the covering layer 570 covers the light emitting region. The covering layer 570 consists of transparent material which is transparent to the light emitting wavelength, and the covering layer 570 is thick film of coating material. The meaning of the transparency here is that for example, a transmissivity is 80% or over for the light emitting wavelength.

Explanation of Effect:

As explained above, according to the embodiment, because it is such an aspect to cover both of the light emitting region of light emitting diode formed in the semiconductor thin film and the semiconductor thin film by the covering layer 570, adding to the effect of embodiment 1, and embodiment 2, it will has a better protection effect. Further, the covering layer 570 has a function of protecting semiconductor thin film.

The next explanation is about transformation example of embodiment 3.

Figure 19:
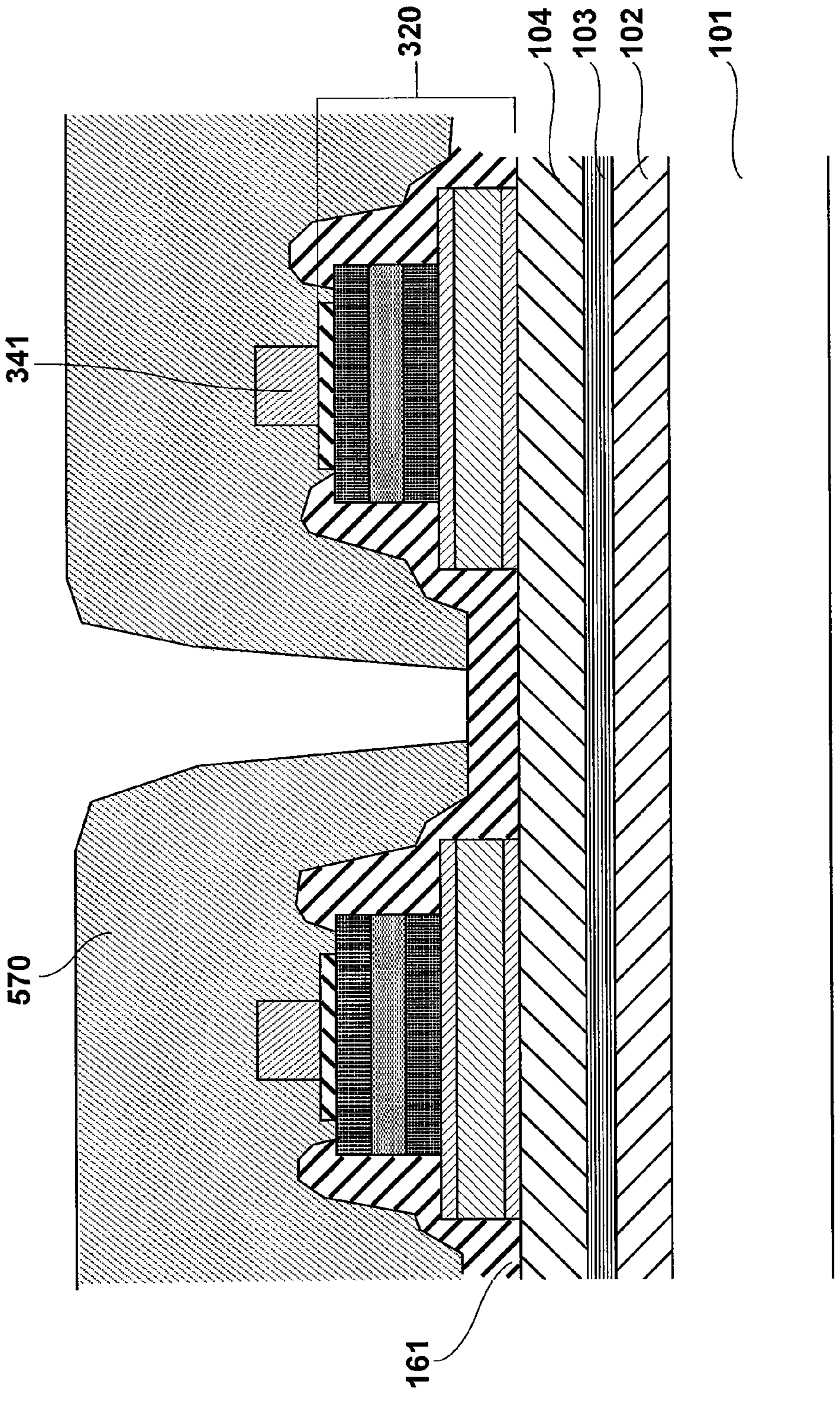
FIG. 19 is a diagram for explaining a transformation example (1) of semiconductor device in embodiment 3 of the present invention.

FIG. 19 is a diagram for explaining a transformation example (1) of semiconductor device in embodiment 3 of the present invention.

As shown in FIG. 19, it is possible to remove the passivation film 162 (FIG. 2).

Figure 20:
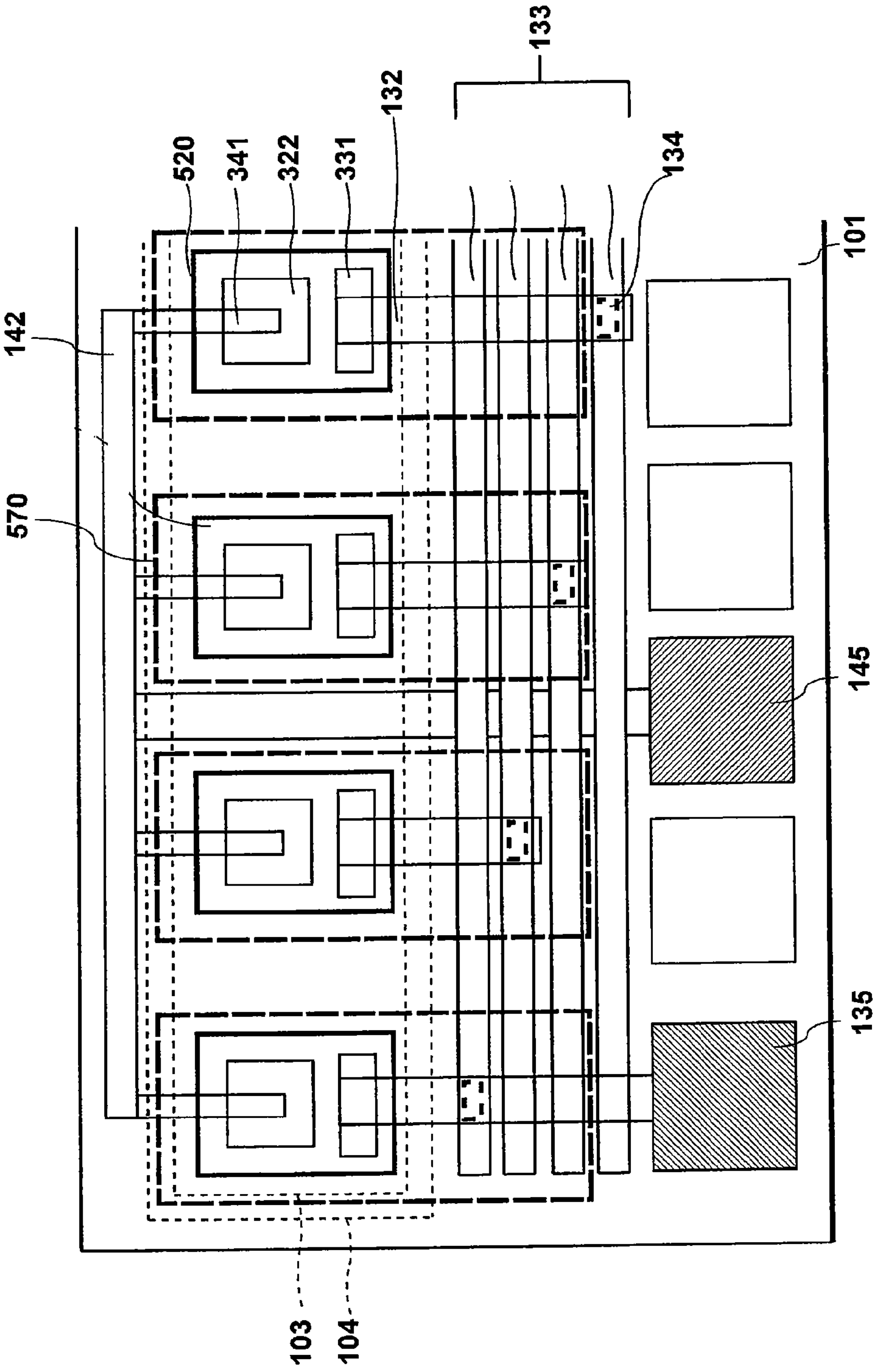
FIG. 20 is a diagram for explaining a transformation example (2) of semiconductor device in embodiment 3 of the present invention.
Figure 21:
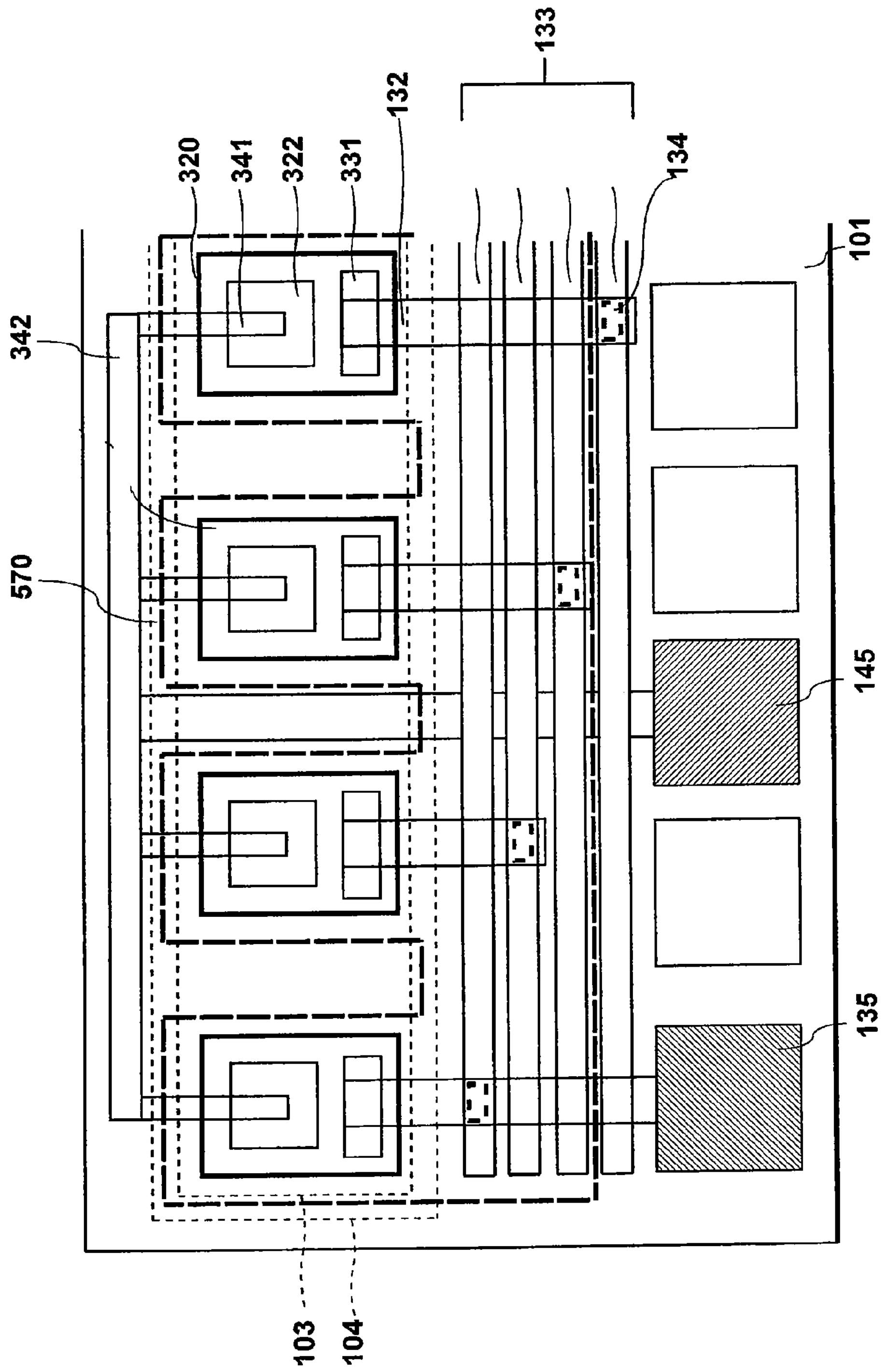
FIG. 21 is a diagram for explaining a transformation example (3) of semiconductor device in embodiment 3 of the present invention.

FIG. 20 shows a diagram to describe a transformation example (2) of semiconductor device in embodiment 3 of the present invention; FIG. 21 shows a diagram to describe a transformation example (3) of semiconductor device in embodiment 3 of the present invention; and FIG. 22 shows a diagram for explaining a transformation example (4) of semiconductor device in embodiment 3 of the present invention.

Figure 22:
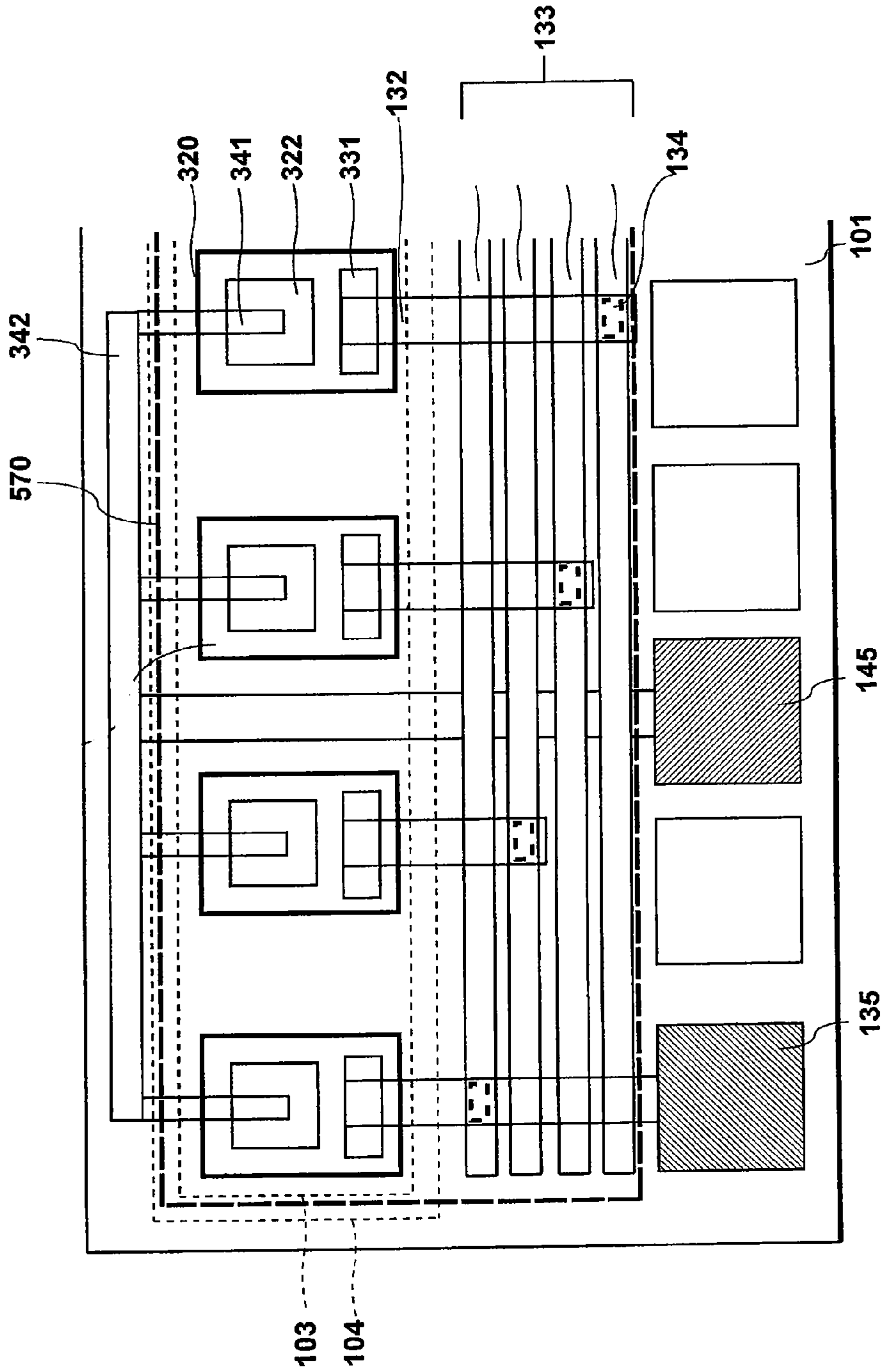
FIG. 22 is a diagram for explaining a transformation example (4) of semiconductor device in embodiment 3 of the present invention.

As shown in FIG. 22, it is possible for the edge of the covering layer 570 to extend to the vicinity of connection pad (FIG. 20).

Further, the covering layer 570 may be formed as being separated between semiconductor thin films and as being incorporate on other regions (FIG. 21). Furthermore, the covering layer 570 can be formed as completely separated or as being incorporate in whole without any separation (FIG. 22).

Embodiment 4

In the embodiment, LED print head consists of semiconductor devices which are explained in the embodiment 1 to 3.

Figure 23:
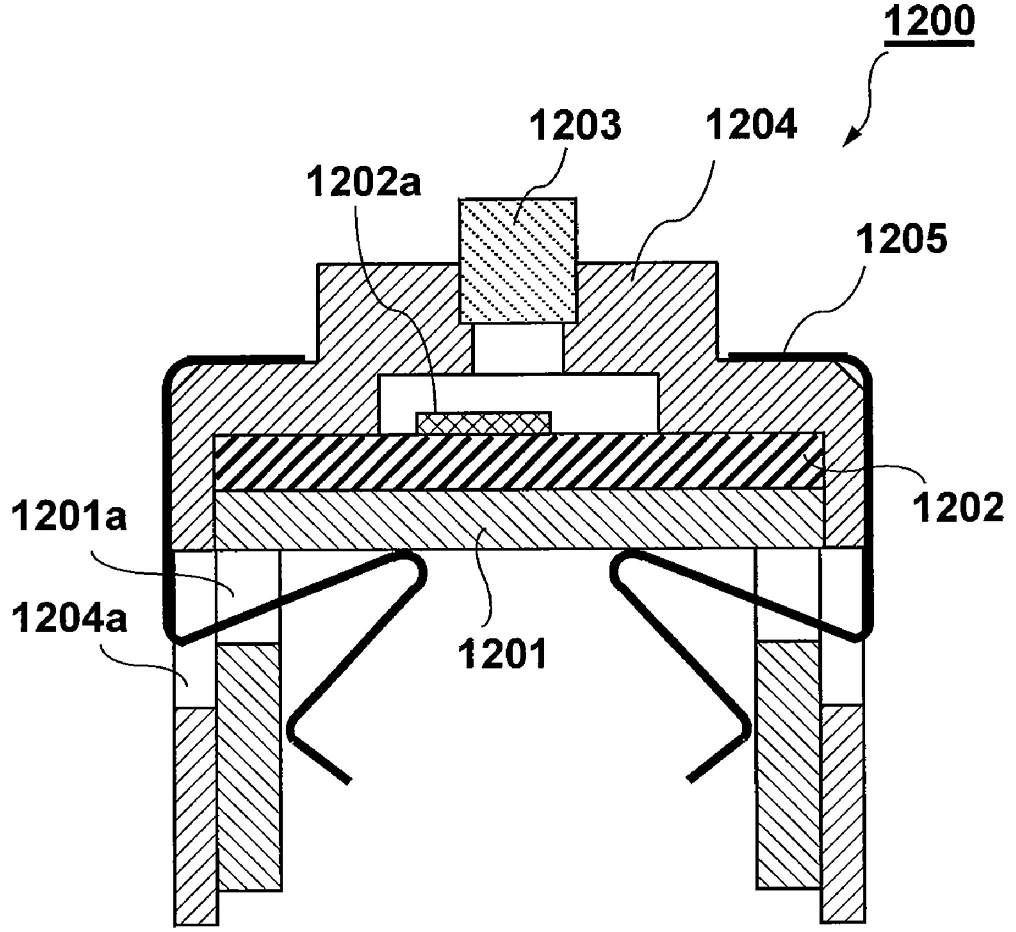
FIG. 23 is a cross section showing LED head of the present invention.
Figure 24:
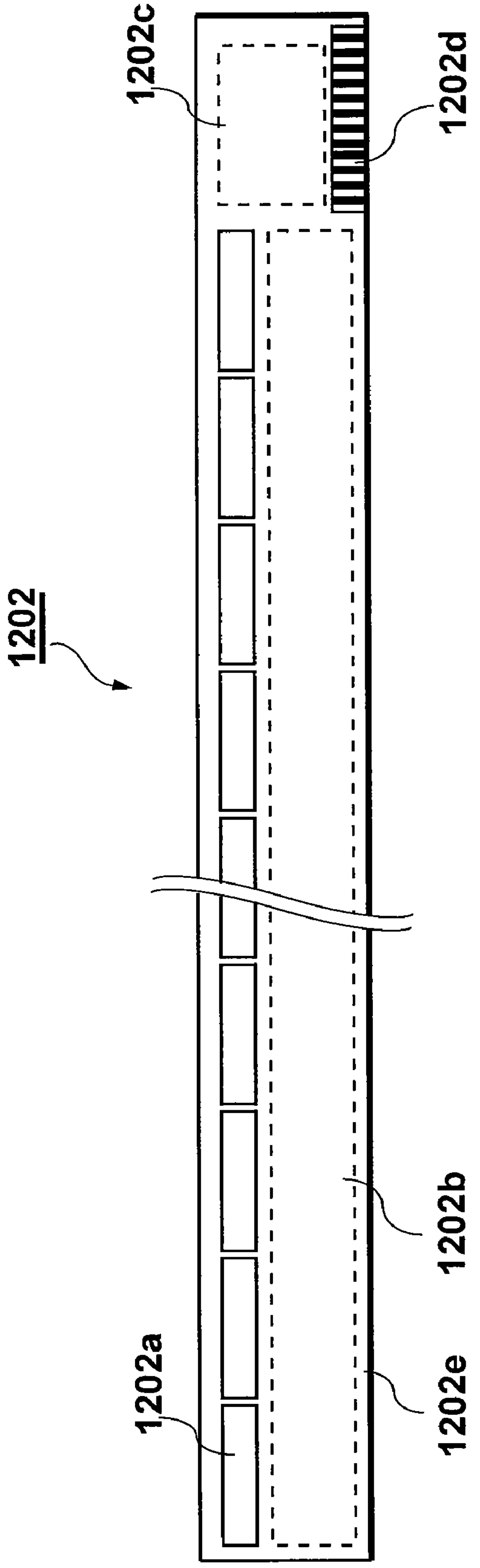
FIG. 24 is a plane diagram showing LED unit of the present invention.

FIG. 23 shows a cross section of the LED print head of the present invention; and FIG. 24 shows a plane diagram of LED unit (COB(chip on board)) of the LED print head of the present invention.

As shown in FIG. 23 and FIG. 24, LED print head unit 1202 is loaded on the base member 1201. In the LED print head unit 1202, LED element (thin film LED array) which is used as the semiconductor device explained in the embodiments 1 to 3, is mounted on the mounting substrate, such as a printed circuit board(COB).

As shown in FIG. 23 and FIG. 24, on the mounting substrate 1202*e*, semiconductor hybrid device chips 1202*a* are mounted plurally along a longitudinal direction as light emitting section. the semiconductor hybrid chip is composed of light emitting section and driving IC section as described in the embodiment 1 to 3.

Further, on the COB 1202*e*, electric element wiring area 1202*b*, and electrical device mounting area 1202*c*. 1202*d* indicates a connector portion used for supplying controlling signals and powers from external electrical circuits and power supply, are furnished.

Rod-lens-array 1203 is furnished above the light emitting section of the semiconductor hybrid device chip 1202*a* to focus the light radiated from the light emitting section on an photo receptor drum. The rod-lens-array 1203 is formed by plurally arranging columnar optics lens in a straight line shape along the light emitting section unit; and is held in an appointed position by a lens holder serving as optics element holder.

The lens holder 1204 is formed as covering a base member 1201 and a LED unit 1202, as shown in FIG. 23 and FIG. 24. Further, the base member 1201, the LED unit 1202 and the lens holder 1204 are held as a whole by a clamper 1205 which is furnished through the opening portions 1201*a*, 1204*a* formed by the base member 1201 and the lens holder 1204. So, the light emitted from the light emitting section on the LED print-head unit 1202 passes through rod-lens-array 1203 to irradiate on the appointed external member. The LED print head 1200 is used as exposing device in electro photography printer (optical printer), copier (multi-function printer), facsimile and so on.

As above stated, according to the aspect of LED print head in the embodiment, as the LED print head unit 1202, because one of the semiconductor devices stated above in the embodiments 1 to 3 is used, so it is possible to supply LED print-head with high quality and high reliability.

Embodiment 5

In the embodiment, there will be an explanation about image forming apparatus which is furnished by using the LED head formed in the embodiment.

Figure 25:
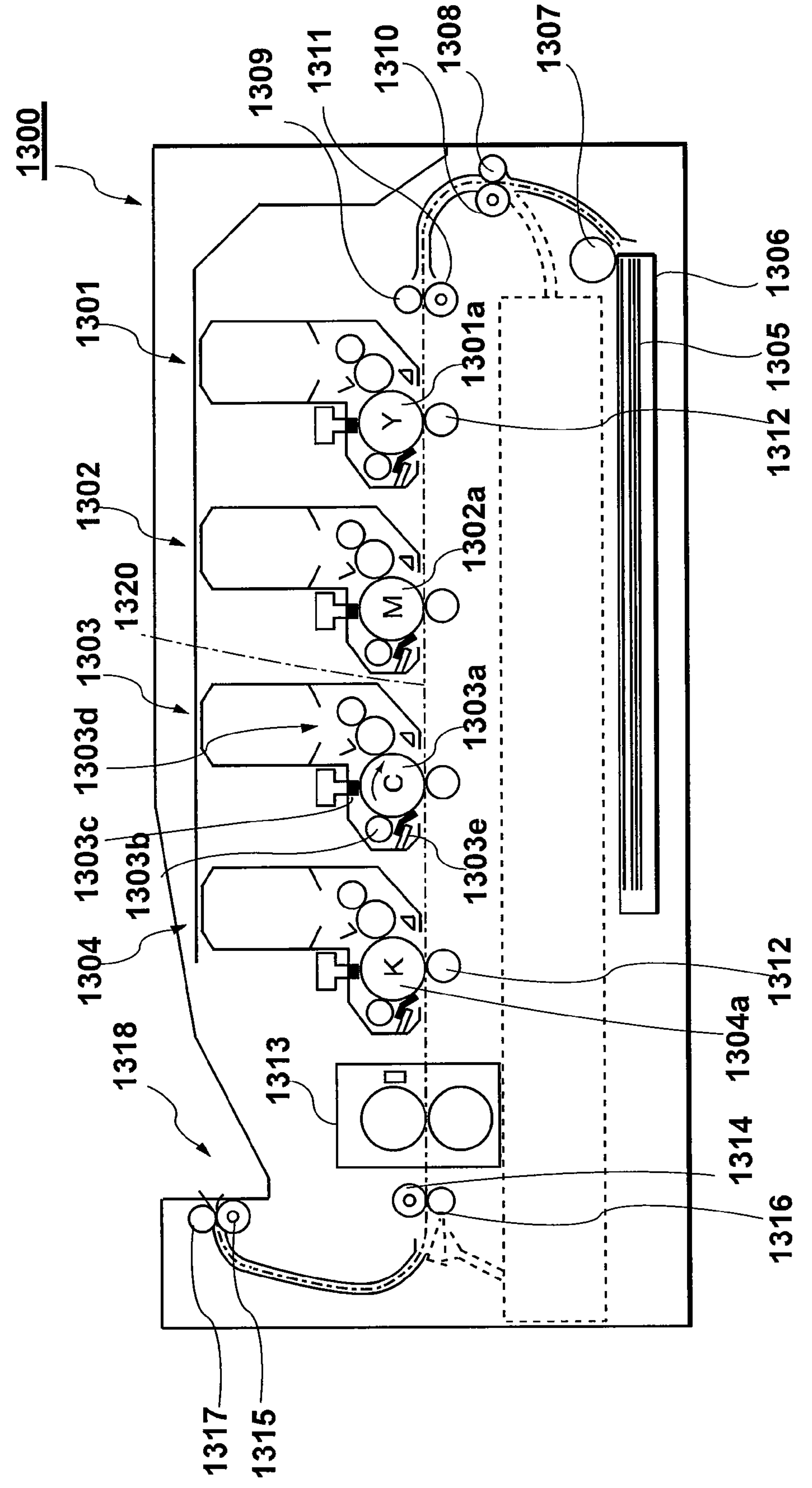
FIG. 25 is an important cross section showing an image forming apparatus of the present invention.

FIG. 25 is an important cross section showing an image forming apparatus of the present invention.

As shown by the FIG. 25, in image forming apparatus 1300, four process units from 1301 to 1304 that respectively form images of yellow, magenta, cyan and black, are arranged sequentially from upstream along a conveyance route 1320 of record medium 1305. Because the internal structure of the process unit from 1301 to 1304 is same, the internal structure of the cyan process unit 1303 is explained in the following as an example.

In the process unit 1303, a photosensitive drum 1303*a* is furnished to be rotary along arrow direction, as image carrying body. Around the photosensitive drum 1303*a*, from upstream side of a rotation direction of the photosensitive drum 1303*a*, a charging device 1303*b* supplying electricity to the surface of the photosensitive drum 1303*a*; and an exposing device 1303*c* which selectively emits light on the surface of the charged photosensitive drum 1303*a* so as to form an electrostatic latent image, are furnished. On the surface of photosensitive drum 1303*a* on which the electrostatic latent image is formed, a developing device 1303*d* which makes toner of predetermined color (cyan) adhere to and performs a development; and a cleaning device 1303*e* which remove toner remaining on the surface of photosensitive drum 1303*a*, are furnished. Further, drum and color that are used in respective devices, can be rotated through driving source and gear that are not shown.

Further, an image forming apparatus has a paper cassette 1306 which is to accommodate record medium 1305 such as paper and is on the underside; and a hopping roller 1307 which is used for separating the record medium 1305 one by one so as to convey the record medium 1305 and locates above the paper cassette 1306. Further, on the downstream side of the hopping roller 1307 in the conveying direction of record medium 1305, pinch rollers 1308, 1309 and registration rollers 1310, 1311 are furnished, that are used for sandwiching the record medium 1305 to correct skew of the record medium 1305 and for conveying to process unit 1301~1304. Hopping roller 1307 and registration rollers 1310, 1311 can be rotated through driving source and gear that are not shown.

In the location facing to each photosensitive drum of process unit from 1301 to 1304, a transferring roller 1312 is arranged which is formed from rubber of semiconductor electricity respectively. In order to make the toner on the photosensitive drum from 1301*a* to 1304*a* adhere to the record medium 1305, potential difference between the surface of the photosensitive drum from 1301*a* to 1304*a* and the surface of each transferring roller 1312 is generated.

A fixing device 1313 has a heating roller and a backup roller, and fixes the toner through pressing and heating the toner transferred on the record medium 1305. Further, ejecting rollers 1314, 1315 sandwich the record medium 1305 sent out from the fixing device 1313 and convey the record medium 1305 to an external record medium stacker section 1318, together with pinch rollers 1316, 1317 of ejecting section. Ejecting roller 1314, 1315 can be rotated together through driving source and gear that are not shown. As the exposing device 1303*c* used here, the LED print head 1200 explained in embodiment 10 is used.

The following is explanation about movement of above stated formed image forming apparatus.

Firstly, record medium 1305, being hold in paper cassette 1306, is separated to pieces from up and conveyed through the hopping roller 1307. Secondly, the record medium 1305 is sandwiched and is conveyed to photosensitive drum 1301*a* and transferring roller 1312 of the process unit 1301 by registration rollers 1310, 1311 and pinch rollers 1308, 1309. Then, the record medium 1305 is sandwiched by the photosensitive drum 1301*a* and the transferring roller 1312, and is conveyed through the rotation of the photosensitive drum 1301*a* while the toner image is transferred on the record medium.

Likewise, the record medium 1305 sequentially passes through the process units from 1302 to 1304. In the passing process, the electrostatic latent image formed by each exposing device from 1301*c* to 1304*c*, is developed by developing device from 1301*d* to 1304*d*. And the toner of respective colors is sequentially transferred and superimposed on the record medium. Further, after superimposed the toner image of respective colors on the record medium 1305, the record medium 1305 on which toner images are fixed by the fixing device 1313, is sandwiched by ejecting rollers 1314, 1315 and pinch rollers 1316, 1317; and is ejected to the external record medium stacker 1318 of the image forming apparatus 1300.

As the explanation above, according to the image forming apparatus in the embodiment, because using the LED print head explained in embodiment 4, so an image forming apparatus with high quality and high reliability can be supplied.

The Utilization Possibility on Industry:

In the explanation of embodiment. The present invention is limited to explain the LED having semiconductor element of thin film, however, the present invention is not limited by the example. That is, the present invention can also be applied to light emitting thyristor.

That is, the present invention is not limited to the foregoing embodiments but many modifications and variations are possible within the spirit and scope of the appended claims of the invention.

What is claimed is:

1. A semiconductor device formed by using a semiconductor thin film bonded by intermolecular force on a substrate, the semiconductor device comprising:

at least two laterally spaced-apart semiconductor thin films;

a semiconductor element formed in each semiconductor thin film, the semiconductor element having a light emitting region;

a covering layer covering at least an entire outer perimeter of each semiconductor thin film and covering at least one part of an electroconductive member connecting with the semiconductor thin films, the covering layer having an opening portion which leaves open the light emitting region; and a passivation film layer between each semiconductor thin film and the covering layer, the passivation film layer covering the entire light emitting region.

2. The semiconductor device according to claim 1, wherein each semiconductor thin film has a pn junction region, the covering layer provides an opening portion above the pn junction region.

3. The semiconductor device according to claim 2, wherein each semiconductor thin film is divided into plural semiconductor thin film parts, the plural semiconductor thin film parts are covered by the covering layer which is not divided.

4. The semiconductor device according to claim 2, wherein the semiconductor thin film is divided into plural semiconductor thin film parts, the covering layer is at least divided at a division region of the semiconductor thin film.

5. The semiconductor device according to claim 4, wherein the covering layer is divided at every division region of the semiconductor thin film and each of the plural semiconductor thin film parts is covered by each of the divided covering layers.

6. The semiconductor device according to claim 5, wherein the covering layer extends to a region out of the semiconductor thin film; and the covering layer is at least divided at the division region of the semiconductor thin film, but is not divided except at the division region of the semiconductor thin film.

7. The semiconductor device according to claim 1, wherein each semiconductor element is a light emitting diode.

8. The semiconductor device according to claim 1, wherein the covering layer is a coating material.

9. The semiconductor device according to claim 8, wherein a main constituent of the coating material is an organic material.

10. The semiconductor device according to claim 1, wherein a thickness of the covering layer is 1μm or above.

11. The semiconductor device according to claim 1, wherein the passivation film layer is an inorganic material insulation film layer.

12. The semiconductor device according to claim 11, wherein the inorganic material insulation film layer has a region directly contacting with at least a part of the semiconductor thin film, and the inorganic material insulation film layer covers at least a part region of an electrode of the semiconductor element.

13. The semiconductor device according to claim 12, wherein the inorganic insulation film covers all regions of each semiconductor thin film.

14. The semiconductor device according to claim 1, further comprising:

a connection pad for connecting with external, electronic circuits, wherein the covering layer extends to a vicinity of the connection pad.

15. The semiconductor device according to claim 1, wherein the substrate is formed of Si crystal.

16. An optical print head comprising:

a semiconductor device formed by using at least two laterally spaced-apart semiconductor thin films bonded by intermolecular force on a substrate, a semiconductor element formed in each semiconductor thin film, the semiconductor element having a light emitting region, a covering layer covering at least an entire outer perimeter of each semiconductor thin film and covering at least one part of an electroconductive member connecting with the semiconductor thin films, the covering layer having an opening portion which leaves open the light emitting region, and a passivation film layer between each semiconductor thin film and the covering layer, the passivation film layer covering the entire light emitting region.

17. An image forming apparatus comprising:

an optical print head comprising a semiconductor device formed by using at least two laterally spaced-apart semiconductor thin films bonded by intermolecular force on a substrate a semiconductor element formed in each semiconductor thin film, the semiconductor element having a light emitting region, a covering layer covering at least an entire outer perimeter of each semiconductor thin film and covering at least one part of an electroconductive member connecting with the semiconductor thin films, the covering layer having an opening portion which leaves open the light emitting region, and a passivation film layer between each semiconductor thin film and the covering layer, the passivation film layer covering the entire light emitting region.

* * * * *